US009583572B2

(12) United States Patent
Basker et al.

(10) Patent No.: US 9,583,572 B2
(45) Date of Patent: Feb. 28, 2017

(54) FINFET DEVICES HAVING SILICON GERMANIUM CHANNEL FIN STRUCTURES WITH UNIFORM THICKNESS

(71) Applicant: International Business Machines Corporation, Armonk, NY (US)

(72) Inventors: Veeraraghavan S. Basker, Schenectady, NY (US); Keith E. Fogel, Hopewell Junction, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/750,190

(22) Filed: Jun. 25, 2015

(65) Prior Publication Data

US 2016/0380058 A1   Dec. 29, 2016

(51) Int. Cl.
| | |
|---|---|
| *H01L 29/66* | (2006.01) |
| *H01L 29/161* | (2006.01) |
| *H01L 29/06* | (2006.01) |
| *H01L 21/321* | (2006.01) |
| *H01L 21/3213* | (2006.01) |
| *H01L 29/78* | (2006.01) |
| *H01L 27/088* | (2006.01) |

(52) U.S. Cl.
CPC ...... *H01L 29/161* (2013.01); *H01L 21/32105* (2013.01); *H01L 21/32115* (2013.01); *H01L 21/32134* (2013.01); *H01L 27/0886* (2013.01); *H01L 29/0692* (2013.01); *H01L 29/66545* (2013.01); *H01L 29/66795* (2013.01); *H01L 29/785* (2013.01)

(58) Field of Classification Search
CPC .................... H01L 27/0886; H01L 29/785
USPC .................................... 257/192, 401
See application file for complete search history.

(56) References Cited

U.S. PATENT DOCUMENTS

| | | | |
|---|---|---|---|
| 7,074,656 B2 | 7/2006 | Yeo et al. | |
| 8,211,772 B2 | 7/2012 | Kavalieros et al. | |
| 8,395,195 B2 | 3/2013 | Chang et al. | |
| 8,497,177 B1 | 7/2013 | Chang et al. | |
| 9,245,882 B2* | 1/2016 | Ching | H01L 27/0886 |
| 2008/0003725 A1 | 1/2008 | Orlowski | |

(Continued)

*Primary Examiner* — David Vu
*Assistant Examiner* — Brandon Fox
(74) *Attorney, Agent, or Firm* — Louis J. Percello; Ryan, Mason & Lewis, LLP

(57) ABSTRACT

Methods are provided to fabricate semiconductor devices, e.g., FinFET devices, having fin channel structures formed of silicon-germanium alloy layers with uniform thickness. For example, a method includes forming a semiconductor fin structure having sidewalls that define a first width of the semiconductor fins structure, and a hard mask layer disposed on a top surface of the semiconductor fin structure. Portions of the sidewalls are etched to form recessed sidewalls that define a thinned portion, wherein a distance between the recessed sidewalls defines a second width of the thinned portion of the semiconductor fin structure, which is less than the first width. Facetted semiconductor alloy layers are formed on the recessed sidewalls, and then anisotropically etched using the hard mask layer as an etch mask to form planarized semiconductor alloy layers of uniform thickness on the recessed sidewalls of the thinned portion of the semiconductor fin structure.

20 Claims, 31 Drawing Sheets

(56) References Cited

U.S. PATENT DOCUMENTS

| | | |
|---|---|---|
| 2010/0164102 A1 | 7/2010 | Rachmady et al. |
| 2012/0241818 A1 | 9/2012 | Kavalieros et al. |
| 2012/0280250 A1* | 11/2012 | Basker .............. H01L 21/82382 257/77 |
| 2014/0030876 A1 | 1/2014 | Flachowsky et al. |
| 2014/0170839 A1 | 6/2014 | Brunco |
| 2016/0027875 A1* | 1/2016 | Kim .................... H01L 29/7856 257/401 |
| 2016/0126353 A1* | 5/2016 | Jacob ................ H01L 29/7851 257/192 |

* cited by examiner

FINFET DEVICES HAVING SILICON GERMANIUM CHANNEL FIN STRUCTURES WITH UNIFORM THICKNESS

TECHNICAL FIELD

This disclosure relates generally to semiconductor fabrication techniques and, in particular, to structures and methods for fabricating semiconductor devices such as FinFETs.

BACKGROUND

FinFET technology is an emerging semiconductor technology that is being developed to provide effective scaling solutions for field effect transistor (FET) fabrication at, and below, the 22 nanometer (nm) node. FinFET structures include one or more narrow semiconductor fin structures, wherein each semiconductor fin structure is gated on at least two sides thereof. FinFET structures may be formed using silicon-on-insulator (SOI) substrates, as SOI technology provides low source/drain diffusion, low substrate capacitance, and ease of electrical isolation by use of shallow trench isolation structures. FinFETs may be also formed on bulk substrates to reduce wafer cost and/or enable formation of certain devices in the bulk substrate.

The implementation of silicon-germanium channels with high-percentage Ge concentration in FinFET devices is a primary choice for future technology nodes. Indeed, SiGe channels are desirable for state-of-the-art planar and trigate CMOS technologies because, e.g., a p-metal-gate results in a higher than desired threshold voltage. For advanced technology nodes such as 10 nm and beyond, FinFET devices having channel fin heights of 50 nm or greater are being developed to achieve enhanced performance. It is problematic and non-trivial, however, to form SiGe channel fin structures at heights of 50 nm or greater.

For example, while semiconductor fins can be formed by depositing a SiGe layer on a substrate and patterning the SiGe layer to form SiGe fin structures, the ability to deposit a high Ge-percentage (~50%-75%) SiGe film with a thickness of 30-60 nm is limited and not practically feasible due to the low critical thickness of high-Ge percentage SiGe alloys. Indeed, the formation of a thick SiGe layer results in high density of defects in the SiGe layer, such as stacking faults, due to high lattice mismatch. Moreover, while thin SiGe layers can be grown on the sidewalls of silicon fin structures (with active fin heights greater than 30 nm), such growth results in non-uniform or facetted growth of SiGe layers on the fin sidewalls (110 surfaces). This can result in variation of device performance due to the non-uniform thickness of the SiGe channel layer along the fin width.

SUMMARY

One embodiment of the invention includes a method of forming a semiconductor device. The method includes forming a semiconductor fin structure on a substrate, wherein the semiconductor fin structure comprises a first sidewall and a second sidewall, wherein a distance between the first and second sidewalls defines a first width of the semiconductor fin structure. The semiconductor fin structure comprises a hard mask layer disposed on a top surface thereof, wherein the hard mask layer comprises a width that is substantially equal to the first width of the semiconductor fin structure. Portions of the first and second sidewalls of the semiconductor fin structure are etched to form first and second recessed sidewalls that define a thinned portion of the semiconductor fin structure, wherein a distance between the first and second recessed sidewalls defines a second width of the thinned portion of the semiconductor fin structure, which is less than the first width. Semiconductor alloy layers are formed on the first and second recessed sidewalls of the thinned portion of the semiconductor fin structure. The semiconductor alloy layers are anisotropically etched using the hard mask layer disposed on the semiconductor fin structure as an etch mask to form planarized semiconductor alloy layers of uniform thickness on the first and second recessed sidewalls of the thinned portion of the semiconductor fin structure.

Another embodiment of the invention includes a method of forming a semiconductor field effect transistor device. The method includes forming a semiconductor fin structure on a substrate. The semiconductor fin structure comprises a first sidewall and a second sidewall, wherein a distance between the first and second sidewalls defines a first width of the semiconductor fin structure. The semiconductor fin structure comprises a hard mask layer disposed on a top surface thereof, wherein the hard mask layer comprises a width that is substantially equal to the first width of the semiconductor fin structure. A sacrificial gate structure is formed on a portion of the semiconductor fin structure and hard mask layer, wherein the portion of the semiconductor fin structure covered by the sacrificial gate structure defines a channel region of an FET (field effect transistor). A gate insulating layer is formed over the sacrificial gate structure. Source and drain regions are formed on portions of the semiconductor fin structure not covered by the sacrificial gate structure. An opening is etched in the gate insulating layer to expose the sacrificial gate structure. The sacrificial gate structure is etched down to the substrate to expose the channel region of the semiconductor fin structure and the hard mask layer. The first and second sidewalls of the exposed channel region of the semiconductor fin structure are etched to form first and second recessed sidewalls that define a thinned portion of the semiconductor fin structure, wherein a distance between the first and second recessed sidewalls defines a second width of the thinned portion of the semiconductor fin structure, which is less than the first width. Semiconductor alloy layers are grown on the first and second recessed sidewall of the thinned portion of the semiconductor fin structure. The semiconductor alloy layers are anisotropically etched using the hard mask layer disposed on the semiconductor fin structure as an etch mask to form planarized semiconductor alloy layers of uniform thickness on the first and second recessed sidewalls of the thinned portion of the semiconductor fin structure. The thinned portion of the semiconductor fin structure and the planarized semiconductor alloy layers of uniform thickness formed on the first and second recessed sidewalls of the thinned portion collectively form a channel fin structure of the FET. A replacement metal gate is formed over the channel fin structure.

Another embodiment of the invention includes a semiconductor device. The semiconductor device includes a semiconductor fin structure disposed on a substrate, a first semiconductor alloy layer and a second semiconductor alloy layer. The semiconductor fin structure is formed of a first semiconductor material. A first portion of the semiconductor fin structure has a first width which is defined by a distance between a first sidewall and a second sidewall of the first portion of the semiconductor fin structure. A second portion of the semiconductor fin structure has a second width, which is less than the first width, wherein the second width is defined by a distance between a first recessed sidewall and a second recessed sidewall of the second portion of the semiconductor fin structure. The first semiconductor alloy layer is formed on the first recessed sidewall of the second portion of the semiconductor fin structure. The second semiconductor alloy layer formed on second recessed sidewall of the second portion of the semiconductor fin structure. The first and second semiconductor alloy layers have a uniform thickness. The second portion of the semiconductor fin structure and the first and second semiconductor alloy layers formed on the first and second recessed sidewalls of the second portion of the semiconductor fin structure define a channel fin structure of an FET (field effect transistor).

These and other embodiments will be described in the following detailed description of embodiments, which is to be read in conjunction with the accompanying figures.

BRIEF DESCRIPTION OF THE DRAWINGS

FIGS. 2, 3, 4A/4B/4C, 5A/5B/5C, 6A/6B/6C, 7A/7B/7C/7D, 8A/8B, 9A/9B, 10, 11A/11B, 12A/12B, 13A/13B, 14A/14B, 15A/15B, 16A/16B, and 17A/7B schematically illustrate a method for fabricating the semiconductor device of FIG. 1, according to an embodiment of the invention, wherein:

FIG. 2 is a cross-sectional view of a semiconductor structure at an initial stage of fabrication starting with a silicon-on-insulator substrate, according to an embodiment of the invention;

FIG. 3 is a cross-sectional view of the semiconductor structure after forming a nitride layer on an SOI layer, according to an embodiment of the invention;

FIGS. 4A, 4B and 4C are schematic views of the semiconductor structure after patterning the nitride layer to form a hard mask, according to an embodiment of the invention, wherein FIG. 4A is a top plan schematic view of the semiconductor structure, FIG. 4B is a cross-sectional schematic view of the semiconductor structure taken along line 4B-4B in FIG. 4A, and FIG. 4C is a cross-sectional schematic view of the semiconductor structure taken along line 4C-4C in FIG. 4A;

FIGS. 5A, 5B, and 5C are schematic views of the semiconductor structure after patterning the SOI layer using the hard mask to form a plurality of semiconductor fin structures, according to an embodiment of the invention, wherein FIG. 5A is a top plan schematic view of the semiconductor structure, FIG. 5B is a cross-sectional schematic view of the semiconductor structure taken along line 5B-5B in FIG. 5A, and FIG. 5C is a cross-sectional schematic view of the semiconductor structure taken along line 5C-5C in FIG. 5A;

FIGS. 6A, 6B, and 6C are schematic views of the semiconductor structure after forming a dummy gate structure over the semiconductor fin structures, according to an embodiment of the invention, wherein FIG. 6A is a top plan schematic view of the semiconductor structure, wherein FIG. 6B is a cross-sectional schematic view of the semiconductor structure taken along line 6B-6B in FIG. 6A, and FIG. 6C is a cross-sectional schematic view of the semiconductor structure taken along line 6C-6C in FIG. 6A;

FIGS. 7A, 7B, 7C, and 7D are schematic views of the semiconductor structure after forming a capping layer and gate sidewall spacers on the dummy gate structure, according to an embodiment of the invention, wherein FIG. 7A is a top plan schematic view of the semiconductor structure, wherein FIG. 7B is a cross-sectional schematic view of the semiconductor structure taken along line 7B-7B in FIG. 7A, wherein FIG. 7C is a cross-sectional schematic view of the semiconductor structure taken along line 7C-7C in FIG. 7A, and wherein FIG. 7D is a schematic side view of the semiconductor structure as viewed from line 7D-7D in FIG. 7A;

FIGS. 8A and 8B are schematic views of the semiconductor structure after performing a source/drain epitaxy process to form source and drain regions, according to an embodiment of the invention, wherein FIG. 8B is a cross-sectional schematic view of the semiconductor structure taken along line 8B-8B in FIG. 8A;

FIGS. 9A and 9B are schematic views of the semiconductor structure after forming a liner layer over the semiconductor structure, according to an embodiment of the invention, wherein FIG. 9B is a cross-sectional schematic view of the semiconductor structure taken along line 9B-9B in FIG. 9A;

FIGS. 11A and 11B are schematic views of the semiconductor structure after removing the dummy gate structure to form a recessed gate region, according to an embodiment of the invention, wherein FIG. 11B is a cross-sectional schematic view of the semiconductor structure taken along line 11B-11B in FIG. 11A;

FIGS. 12A and 12B are schematic views of the semiconductor structure after etching exposed sidewalls of the semiconductor fin structures to form the thinned portions of the semiconductor fin structures within the gate region, according to an embodiment of the invention, wherein FIG. 12B is a cross-sectional schematic view of the semiconductor structure taken along line 12B-12B in FIG. 12A;

FIGS. 13A and 13B are schematic views of the semiconductor structure after growing facetted semiconductor alloy layers on recessed surfaces of the thinned portions of the semiconductor fin structures within the gate region, according to an embodiment of the invention, wherein FIG. 13B is a cross-sectional schematic view of the semiconductor structure taken along line 13B-13B in FIG. 13A;

FIGS. 14A and 14B are schematic views of the semiconductor structure after etching the facetted semiconductor alloy layers to form the planar semiconductor alloy layers with uniform thickness on the recessed sidewalls of the thinned portions of the semiconductor fin structures, according to an embodiment of the invention, wherein FIG. 14B is a cross-sectional schematic view of the semiconductor structure taken along line 14B-14B in FIG. 14A;

FIGS. 15A and 15B are schematic views of the semiconductor structure after forming a gate dielectric layer within the gate region, according to an embodiment of the invention, wherein FIG. 15B is a cross-sectional schematic view of the semiconductor structure taken along line 15B-15B in FIG. 15A;

FIGS. 16A and 16B are schematic views of the semiconductor structure after forming a metallic gate layer within the gate region, according to an embodiment of the invention, wherein FIG. 16B is a cross-sectional schematic view of the semiconductor structure taken along line 16B-16B in FIG. 16A; and FIGS. 17A and 17B are schematic views of the semiconductor structure after forming a metallic gate contact within the gate region, according to an embodiment of the invention, wherein FIG. 17B is a cross-sectional schematic view of the semiconductor structure taken along line 17B-17B in FIG. 17A.

DETAILED DESCRIPTION OF EMBODIMENTS

Embodiments of the invention will now be described in further detail with regard to techniques for fabricating FinFET devices having fin channel structure formed of silicon-germanium alloy layer of uniform thickness. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1:
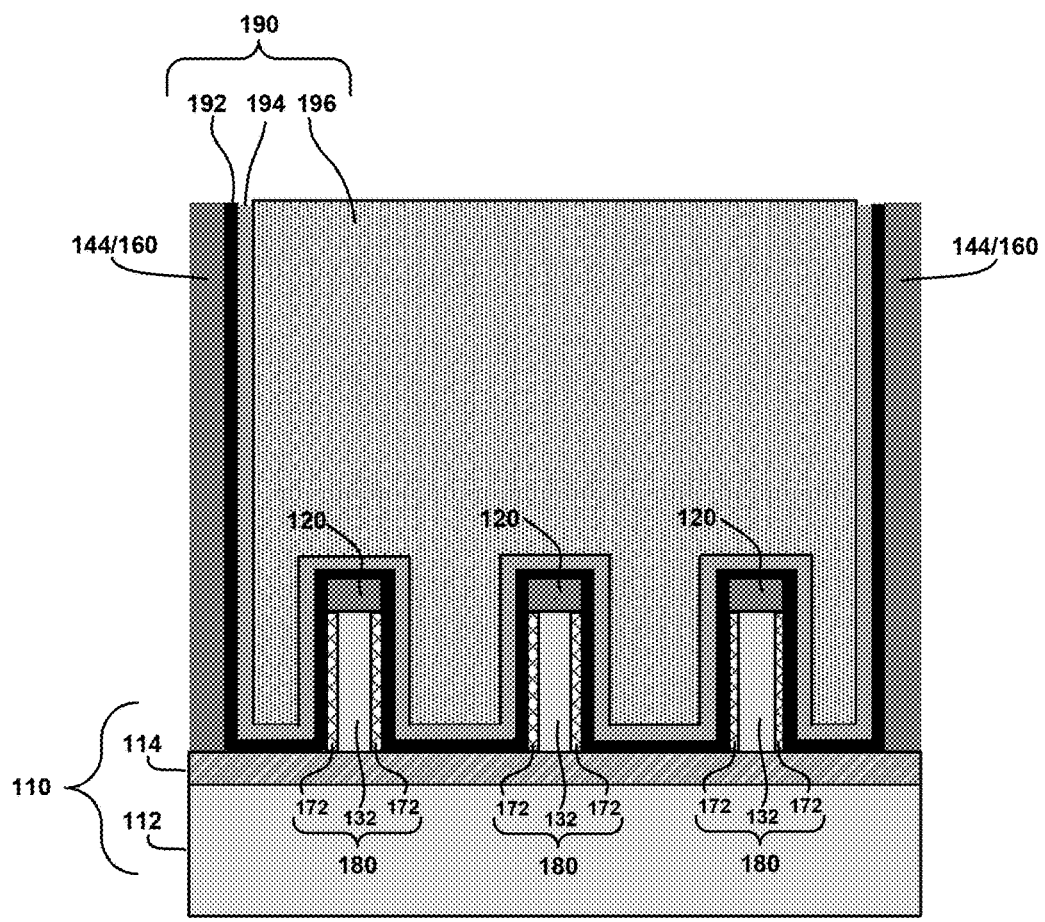
FIG. 1 is a cross-sectional schematic view of a semiconductor device having a fin channel structure formed of silicon-germanium alloy layers with uniform thickness, according to an embodiment of the invention.

FIG. 1 is a cross-sectional schematic view of a semiconductor device having a fin channel structure formed of silicon-germanium alloy layers with uniform thickness, according to an embodiment of the invention. In particular, FIG. 1 schematically illustrates an embodiment of a FinFET device 100 comprising a semiconductor substrate 110, a plurality of channel fin structures 180 formed on the substrate 110, and a replacement gate structure 190 formed over the channel fin structures 180. In one embodiment of the invention, the substrate 110 comprises a base substrate 112 (e.g., silicon layer) and an insulating layer 114. Each channel fin structure 180 comprises a thinned portion 132 of a semiconductor fin structure 130 (which is formed of a first semiconductor material such as silicon) and thin semiconductor alloy layers 172 (e.g., SiGe layers) formed on recessed sidewalls (e.g., etched sidewalls) of the thinned portions 132 of the semiconductor fin structures 130. A hard mask layer 120 is disposed on top of each channel fin structure 180. The replacement gate structure 190 comprises a gate dielectric layer 192, a work function metal layer 194, and a metal electrode 196. A gate region is defined, in part by a gate insulating layer 144/160 (e.g., nitride spacers and liner layer).

The semiconductor device 100 of FIG. 1 can be fabricated using methods that will be discussed in further detail below.

In general, in one embodiment, the semiconductor device 100 is constructed by a process which comprises an initial stage of forming a plurality of semiconductor fin structures 130 on the substrate 110. The semiconductor fin structures 130 include first and second sidewalls, wherein a distance between the first and second sidewalls defines a first width W (see, e.g., FIG. 5B) of the semiconductor fin structures 130. The first width W is maintained for those portions of the semiconductor fin structures 130 (e.g., portions that form source/drain regions) which are not disposed within the defined gate region shown in FIG. 1. However, the thinned portions 132 of the semiconductor fin structures 130 (which are disposed within the defined gate region) are formed to have a second width W' (see, e.g., FIG. 14A) which is less than the first width W. The hard mask layers 120 disposed on top of associated channel fins structures 180 have a width substantially equal to the first width W of the portions of the semiconductor fin structures 130 that are outside the defined gate region.

Prior to forming the thinned portions 132 of the semiconductor fin structures 130, a sacrificial gate structure (e.g., element 140 in FIGS. 6A/6B/6C) is formed on portions of the semiconductor fin structures 130 and associated hard mask layers 120, wherein the portions of the semiconductor fin structures 130 covered by the sacrificial gate structure define channel regions of field effect transistors. A gate insulating layer (e.g., comprising elements 142/144 in FIGS. 7A/7B/7C) is formed over the sacrificial gate structure, and source and drain regions are formed on those portions of the semiconductor fin structures 130 that are covered by the sacrificial gate structure (e.g., those portions that are disposed outside the defined gate region). An opening is etched in the gate insulating layer to expose the sacrificial gate structure, and the sacrificial gate structure is etched down to the substrate to expose the channel regions of the semiconductor fin structures 130 and associated hard mask layers 120.

The first and second sidewalls of the exposed channel regions of the semiconductor fin structures 130 are then etched to form the thinned portions 132 of the semiconductor fin structures 130, wherein the sidewalls of the thinned portions 132 are recessed (via sidewall etching) so that the widths of the thinned portions 132 are smaller than the original width W of the semiconductor fin structures 130. The semiconductor alloy layers 172 are formed by, e.g., epitaxially growing facetted silicon germanium layers on the recessed (etched) sidewalls of the thinned portions 132 of the semiconductor fin structures 130, and anisotropically etching the semiconductor alloy layers using the hard mask layers 120 as an etch mask to form the planarized semiconductor alloy layers 172 of uniform thickness on the recessed sidewalls of the thinned portions 132 of the semiconductor fin structures 130. The replacement gate 190 is then formed in the defined gate region to cover the channel fin structures 180.

Embodiments of the invention enable the formation of thin high-percentage Ge channel layers to be constructed with uniform thickness. Indeed, methods as discussed herein enable a thin silicon germanium film (e.g., 3-4 nm) with high-percentage Ge (e.g., about 50% or more) to be epitaxially grown (without defects) on the etched sidewalls of tall semiconductor fin structures (e.g., silicon fins with heights of about 30 nm or more), while using the hard mask layers 120 to anisotropically etch away the excess SiGe material (e.g., facetted SiGe portions which form a trapezoid or diamond structure) to form SiGe channel layers on tall fin structures, wherein the SiGe channel layers have uniform thickness. Moreover, this process enables the formation of uniform-shaped channel fin structures 180, which enhances device performance.

Figure 2:
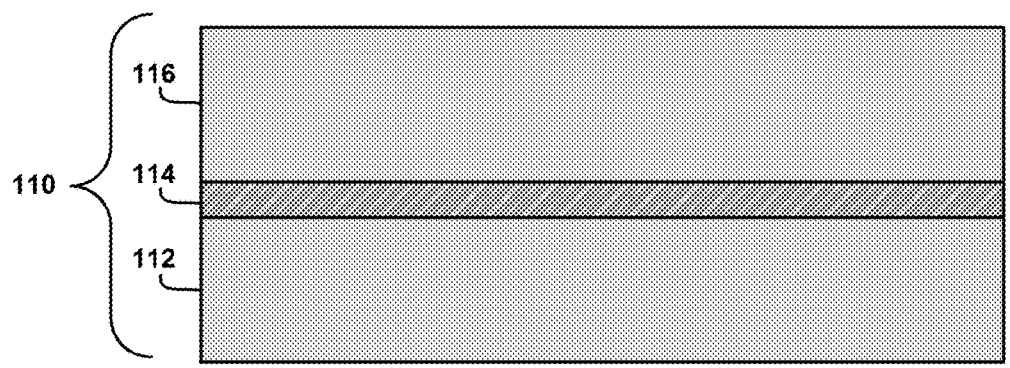

Methods for fabricating the semiconductor device 100 of FIG. 1 will now be discussed in further detail with reference to FIGS. 2, 3, 4A/4B/4C, 5A/5B/5C, 6A/6B/6C, 7A/7B/7C/7D, 8A/8B, 9A/9B, 10, 11A/11B, 12A/12B, 13A/13B, 14A/14B, 15A/15B, 16A/16B, and 17A/7B, which schematically illustrate the semiconductor device of FIG. 1 at various stages of fabrication. FIG. 2 is a cross-sectional view of a semiconductor structure at an initial stage of fabrication starting with a silicon-on-insulator substrate 110, according to an embodiment of the invention. As shown in FIG. 2, the substrate 110 comprises a base substrate layer 112, an insulating layer 114 (e.g., buried oxide layer) and an active semiconductor layer 116 (or SOI layer 116). The insulating layer 114 isolates the active semiconductor layer 116 from the base substrate 112. The base substrate 112 may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. The thickness of the base substrate 112 will vary depending on the application. For example, the base substrate 112 may have a thickness in a range of about 0.5 mm to about 1.5 mm.

The insulating layer 114 may be formed of any dielectric or insulating material which is suitable for the given application. For example, the insulating layer 114 may be formed of material such as, for example, oxides, nitrides, oxynitrides of silicon, and combinations thereof. In addition, the insulating layer 114 may include crystalline or non-crystalline dielectric material. In one embodiment, the insulating layer 114 has a thickness in a range of about 100 nm to about 500 nm, for example.

The SOI layer 116 may be made of silicon or other suitable types of semiconductor materials, such as materials used for the base substrate 112. In general, the base substrate 112 and the SOI layer 116 may include either identical or different semiconducting materials with respect to chemical composition, dopant concentration and crystallographic orientation. The SOI layer 116 may be doped with p-type dopants such as boron or doped with n-type dopants such as phosphorus and/or arsenic. The SOI layer 116 may have a thickness ranging from approximately 30 nm to about 100 nm, for example. In one embodiment of the invention, the target thickness of the SOI layer 116 will be selected based on the desired thickness (or height) of the semiconductor fin structures 130 for the FinFET devices.

In another embodiment of the invention, semiconductor FinFET devices can be fabricated using a bulk FinFET process, wherein semiconductor fin structures are formed in bulk silicon, and an insulating oxide material (e.g., Sift) is deposited in the trenches between the semiconductor fin structures. The insulating oxide material is then etched back to expose some portion of the semiconductor fin structures, thus defining a baseline active fin height.

In an embodiment using the SOI substrate 110 as shown in FIG. 2, semiconductor fin structures are formed, in part, by selectively etching the SOI layer 116 (e.g., silicon layer) down to the insulating layer 114 (e.g., buried oxide layer) using a photolithographic process. In this process, the active fin heights are set by the thickness of the SOI layer 116, which enables precise control, and less variation, of the active fin height as compared to the bulk FinFET process. A process for fabricating semiconductor fin structures is shown in FIGS. 3, 4A/4B/4C, and 5A/5B/5C.

A first step in one exemplary process for fabricating semiconductor fin structures is to form a hard mask that is used for etching the SOI layer 116. FIG. 3 is a cross-sectional view of the semiconductor structure of FIG. 2 after forming a nitride layer 118 on the SOI layer 116, according to an embodiment of the invention. In one embodiment of the invention, the nitride layer 118 is formed with a thickness in a range of about 5 nm to about 15 nm. The nitride layer 118 is then patterned using a photolithographic process, for example, where a layer of photoresist material is deposited on top of the nitride layer 118 and lithographically patterned (exposed and developed) to form a photoresist mask having a target pattern which defines a hard mask pattern and corresponding semiconductor fin pattern to be transferred to the semiconductor layer 116. An etch process is then performed using the photoresist mask to etch exposed portions of the nitride layer 118 down to the semiconductor layer 116 to form a hard mask. The nitride etch process can be performed using a dry etch process such as RIE (reactive ion etching) or other anisotropic etch processes with etching chemistries that are suitable to etch the nitride layer 118.

Figure 3:
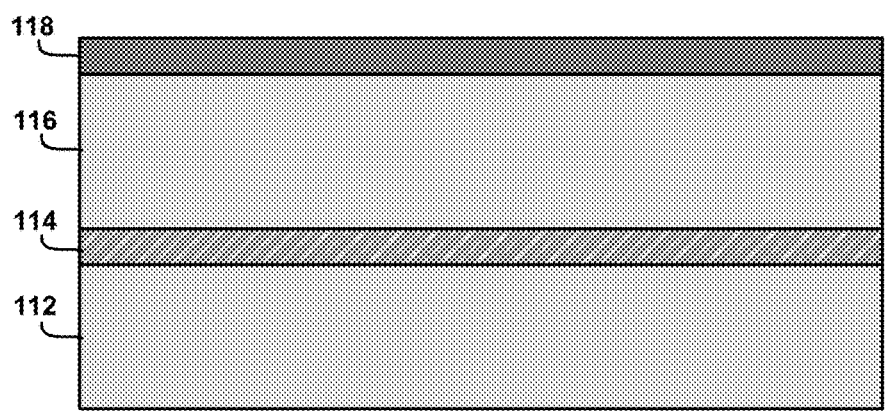
Figure 4A:
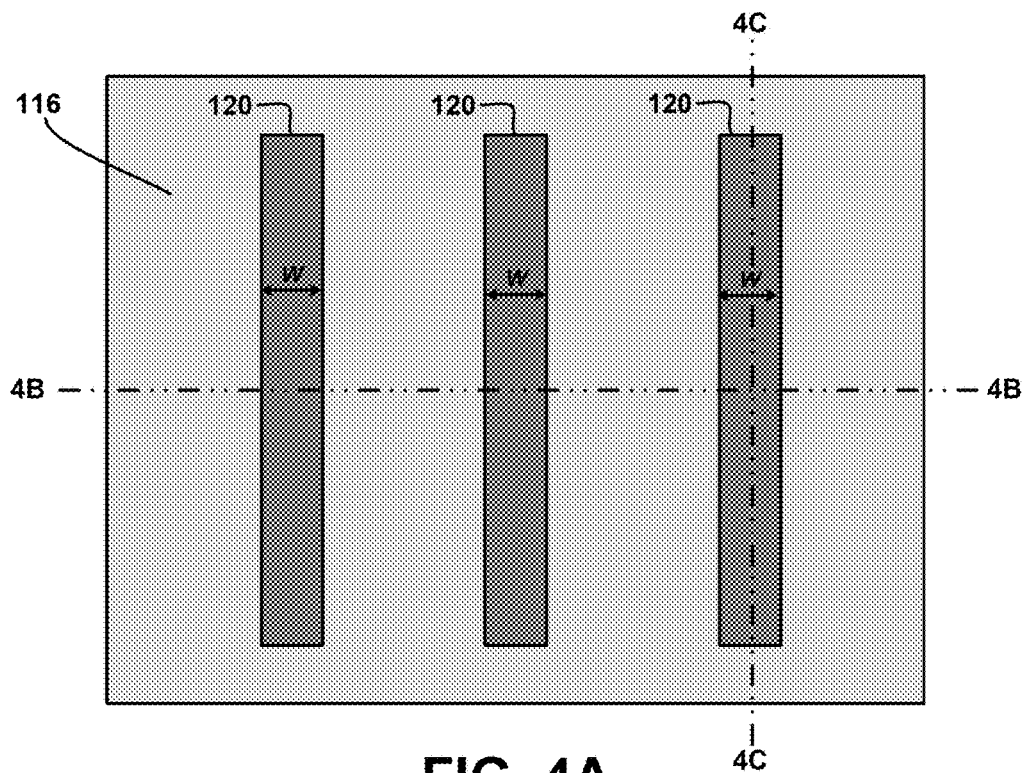
Figure 4B:
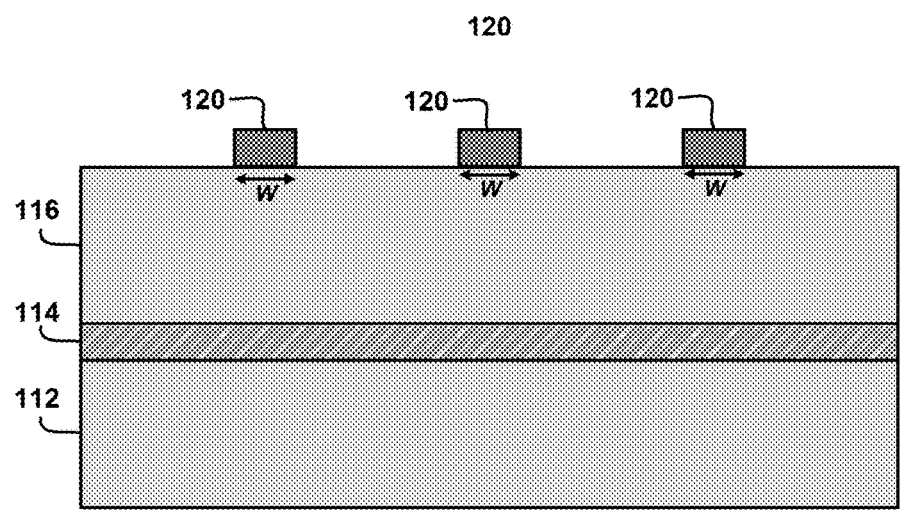
Figure 4C:
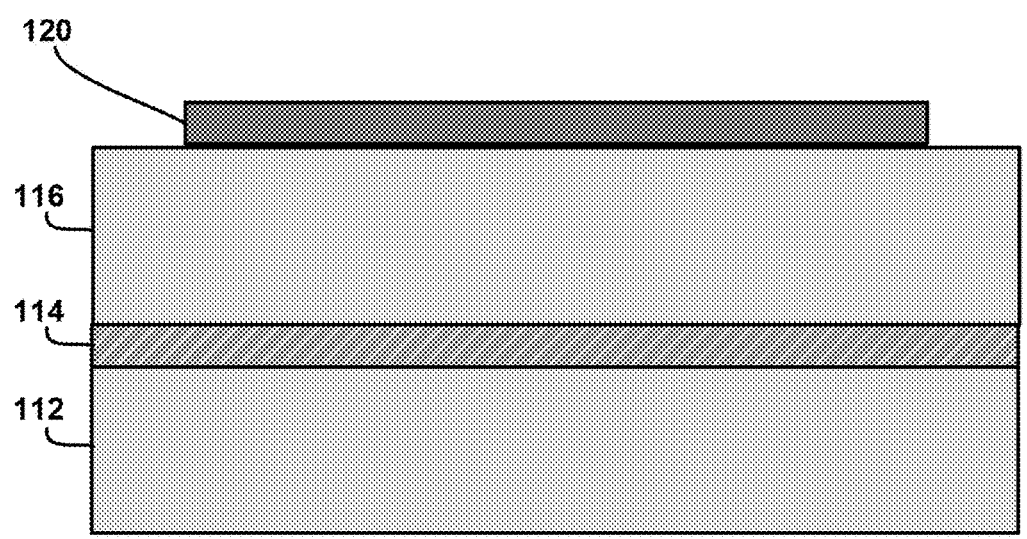

FIGS. 4A, 4B and 4C are schematic views of the semiconductor structure of FIG. 3 after patterning the nitride layer 118 to form a hard mask pattern comprising a plurality of hard mask layers 120, according to an embodiment of the invention. FIG. 4A is a top plan schematic view of the semiconductor structure showing the hard mask layers 120. In addition, FIG. 4B is a cross-sectional schematic view of the semiconductor structure taken along line 4B-4B in FIG. 4A, and FIG. 4C is a cross-sectional schematic view of the semiconductor structure taken along line 4C-4C in FIG. 4A, showing different views of the hard mask layers 120. As specifically shown in FIGS. 4A and 4B, each hard mask layer 120 has a width W.

Figure 5A:
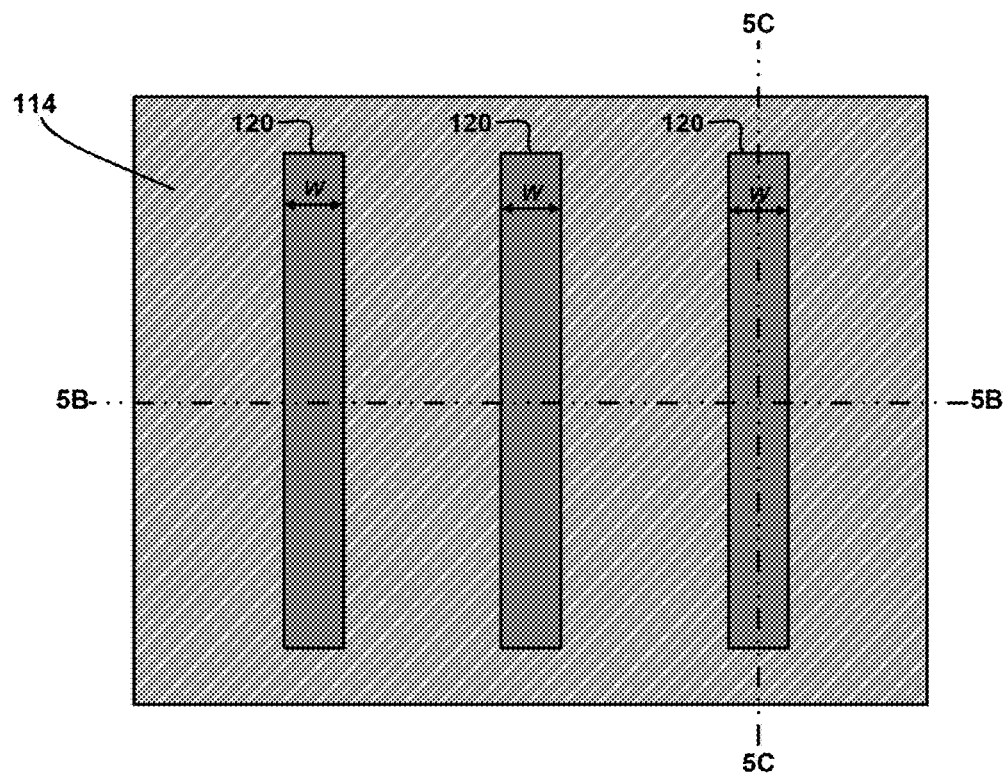
Figure 5B:
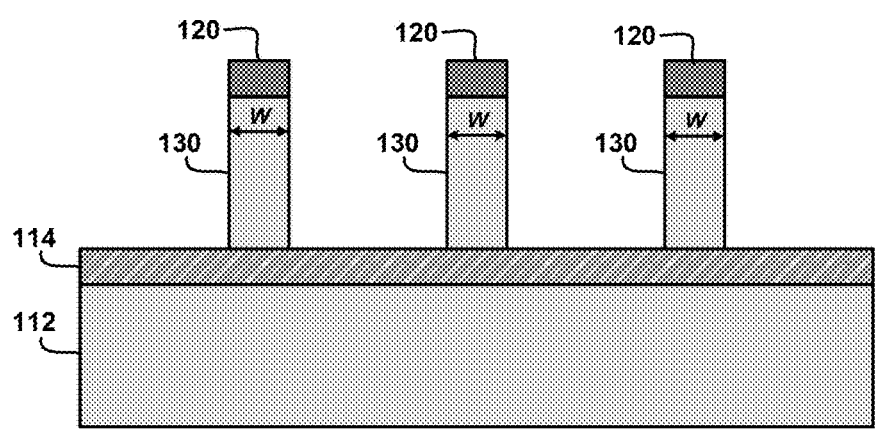
Figure 5C:
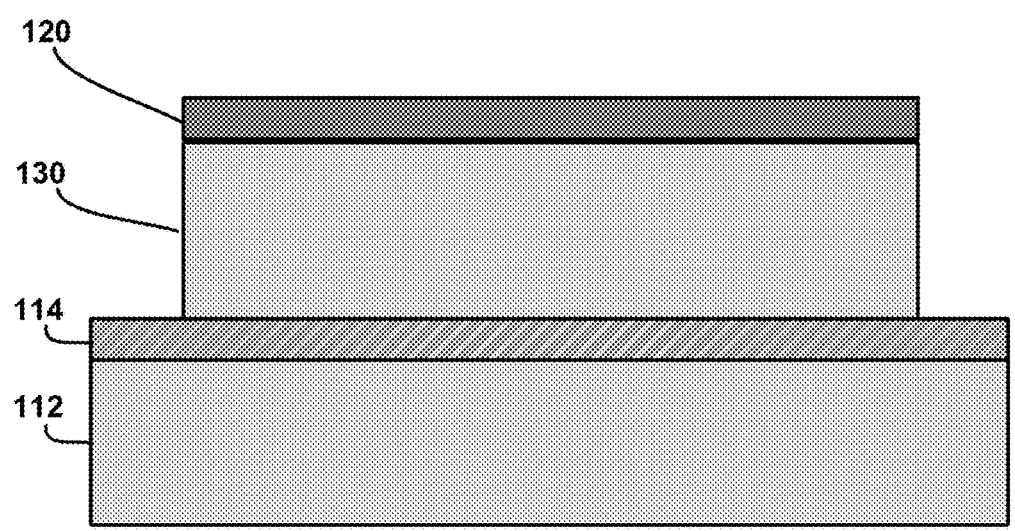

A next step in the exemplary fabrication process comprises patterning the SOI layer 116 to form the semiconductor fin structures 130. For example, FIGS. 5A, 5B and 5C are schematic views of the semiconductor structures shown in FIGS. 4A, 4B and 4C, respectively, after patterning the SOI layer 116 using the hard mask pattern 120 to form a plurality of semiconductor fin structures 130, according to an embodiment of the invention. FIG. 5A is a top plan schematic view of the semiconductor structure showing the removal of the portion of the SOI layer 116 not covered by the hard mask layers 120. In addition, FIG. 5B is a cross-sectional schematic view of the semiconductor structure taken along line 5B-5B in FIG. 5A showing the semiconductor fin structures 130 being formed by etching the SOI layer 116 down to the insulating layer 114 using the pattern of the hard mask layers 120. In addition, FIG. 5C is a cross-sectional schematic view of the semiconductor structure taken along line 5C-5C in FIG. 5A showing a side view along the length of one of the semiconductor fin structures 130.

In one embodiment of the invention, the SOI layer 116 may be etched using an anisotropic etch process such as reactive ion etching (RIE) or plasma etching. In one embodiment of the invention, two separate etch processes may be utilized in which the nitride layer 118 is etched in a first etch process using a photoresist mask to form the hard mask pattern 120, followed by removal of the photoresist mask and a second etch process to etch the SOI layer 116 using the hard mask pattern 120 to form the semiconductor fin structures 130. In another embodiment, the nitride layer 118 and SOI layer 116 may be etched in continuous etch process using the photoresist mask.

In one embodiment of the invention, the semiconductor fin structures 130 are formed to have a width Win a range of about 6 nm to about 20 nm, depending on the application. In addition, as noted above, depending on the thickness of the SOI layer 116, the semiconductor fin structures 130 have a height of about 30 nm to about 100 nm. Further, in one embodiment of the invention, the semiconductor fin structures 130 are spaced with a pitch ranging from about 20 nm to about 80 nm, depending on the application. The height and width of the semiconductor fin structures 130, and the pitch between the semiconductor fin structures 130, will vary depending on the application. Moreover, it is to be understood that for ease of illustration and explanation, three semiconductor fin structures 130 (and three associated channel fin structures 180) are shown throughout the drawings. However, FinFET structures according to other embodiments of the invention can be fabricated with more than three semiconductor fin structures and channel fin structures.

Figure 6A:
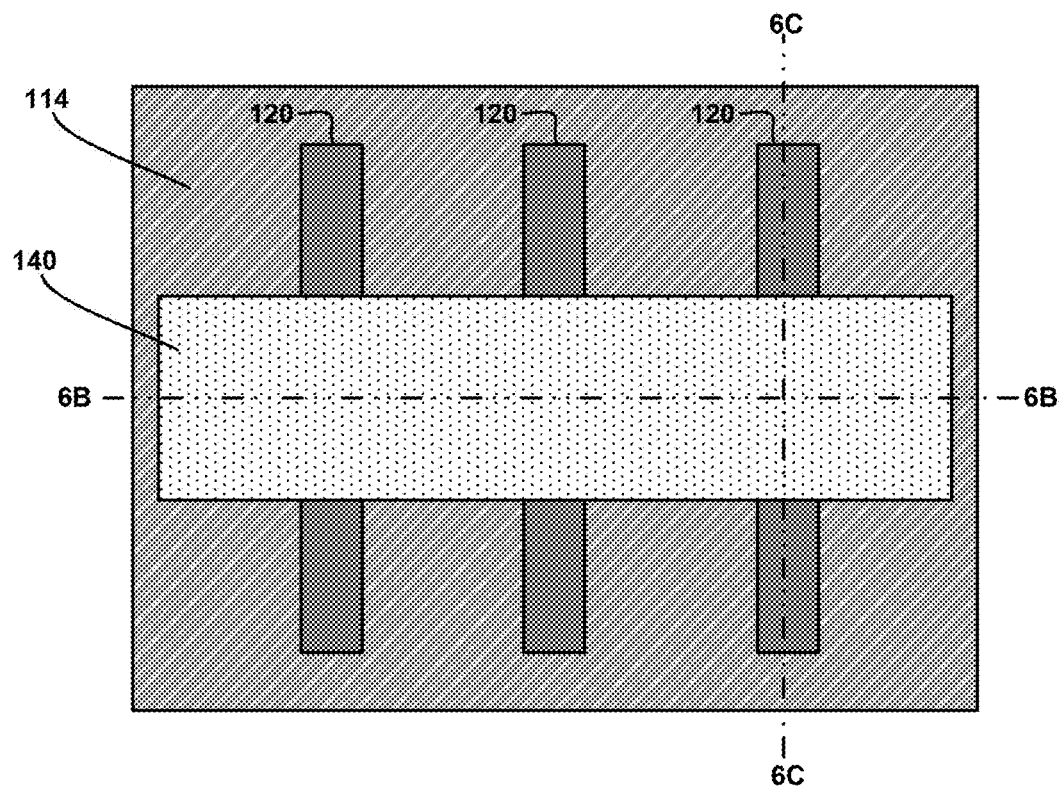
Figure 6B:
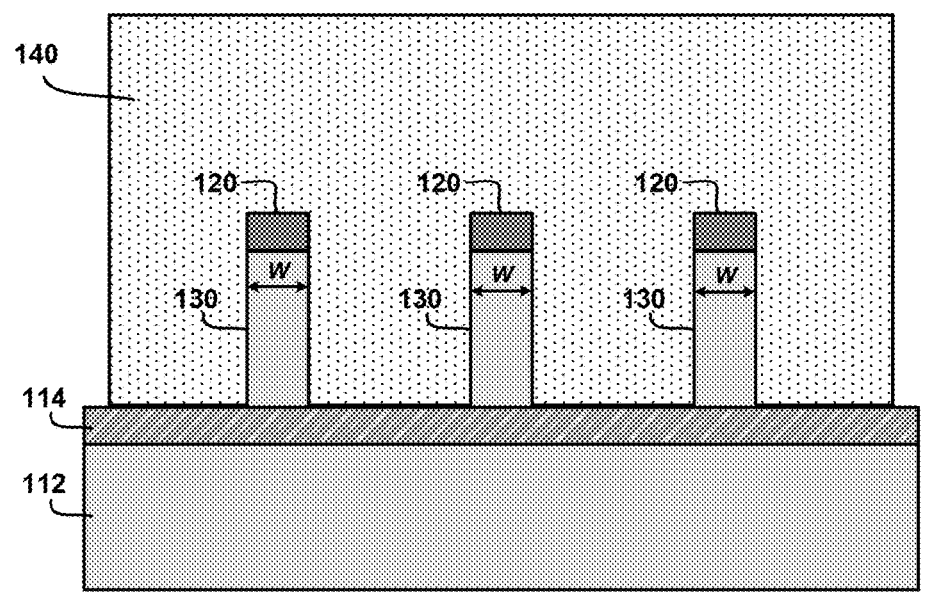
Figure 6C:
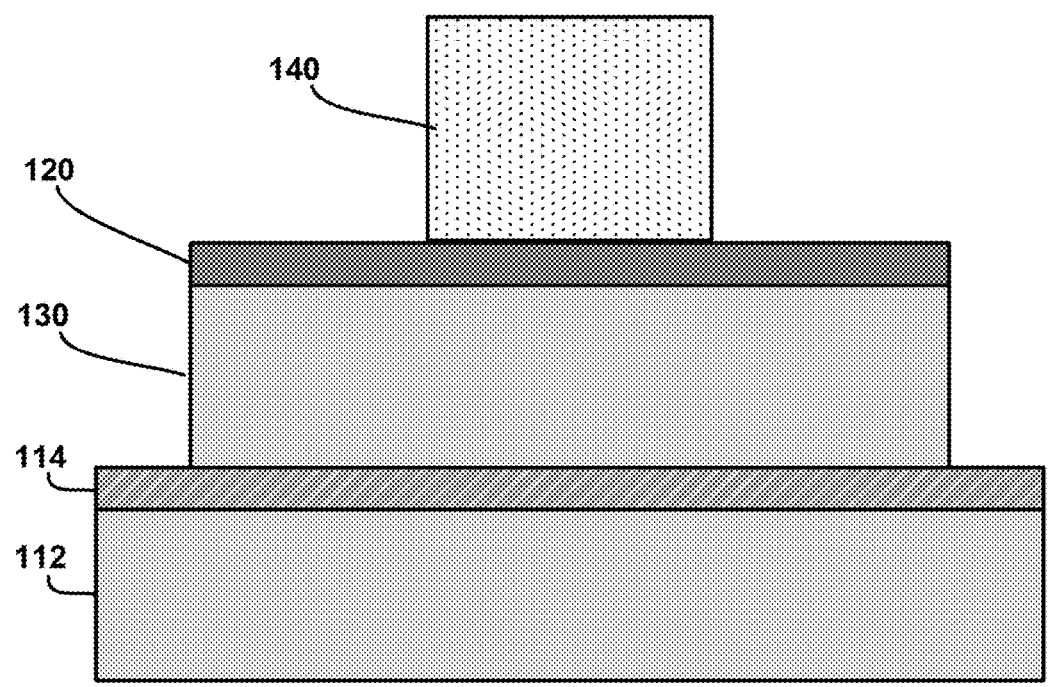

A next step in the exemplary process is to form one or more dummy gate structures for the FinFET devices. FIGS. 6A, 6B, and 6C are schematic views of the semiconductor structures of FIGS. 5A, 5B, and 5C, respectively, after depositing and patterning a layer of polysilicon to form a dummy gate structure 140 over the semiconductor fin structures 130, according to an embodiment of the invention. FIG. 6A is a top plan schematic view of the semiconductor structure showing a dummy gate structure 140 formed in a direction that is orthogonal to the semiconductor fin structures 130. FIG. 6B is a cross-sectional schematic view of the semiconductor structure taken along line 6B-6B in FIG. 6A, showing that the material of the dummy gate structure 140 is disposed between the semiconductor fin structures 130. FIG. 6C is a cross-sectional schematic view of the semiconductor structure taken along line 6C-6C in FIG. 6A, showing a portion of the dummy gate structure 140 above one of the semiconductor fin structures 130 and associated hard mask 120. In one embodiment of the invention, the dummy gate structure 140 is formed to have a thickness (above the hard mask layer 120) in a range of about 40 nm to about 200 nm, for example.

The dummy gate structure 140 can be formed using various techniques known in the art. For example, in one embodiment of the invention, the dummy gate structure 140 is formed of polysilicon, although in other embodiments of the invention, the dummy gate structure 140 may be made of, e.g., an amorphous or polycrystalline silicon material. The material used to form the dummy gate structure 140 can be deposited using any suitable deposition technique known in the art, including atomic layer deposition (ALD), chemical vapor deposition (CVD), physical vapor deposition (PVD), or molecular beam deposition (MBD), for example. Thereafter, the deposited material is patterned (via a suitable lithographic process and etch process) to form the dummy gate structure 140 (or a plurality of dummy gate structures).

In accordance with embodiments of the invention, gate electrodes of FinFET devices are formed using a "gate-last" process which involves, for example, forming one or more of the dummy gate structure 140 (e.g., polysilicon gate), fabricating other elements of the FinFET devices, removing the dummy gate structures, and replacing the removed dummy gate structures with actual gate materials. With this process, for example, the dummy gate structures are sacrificial structures formed of sacrificial material, which are subsequently removed and replaced by a replacement metal gate (RMG) potentially including a gate dielectric layer, a work function metal layer, and a metal electrode using methods as discussed below. Because the RMG structures are formed after the other components of the FinFET devices are formed, the RMG structures are not subjected to various potentially damaging processing steps, for example high-temperature anneals.

After formation of the dummy gate structure 140, several deposition and etching processes are performed to form a gate insulating layer over the dummy gate structure 140 (e.g., to encapsulate the dummy gate structure 140 with insulating material). In one embodiment, the gate insulating layer comprises vertical spacers formed on the sidewalls of the dummy gate structure 140 and a capping layer formed on the top surface of the dummy gate structure 140. For example, FIGS. 7A, 7B, and 7C, and 7D are schematic views of the semiconductor structures shown in FIGS. 6A, 6B and 6C, respectively, after forming a capping layer 142 and gate sidewall spacers 144 on the dummy gate structure 140, according to an embodiment of the invention.

Figure 7A:
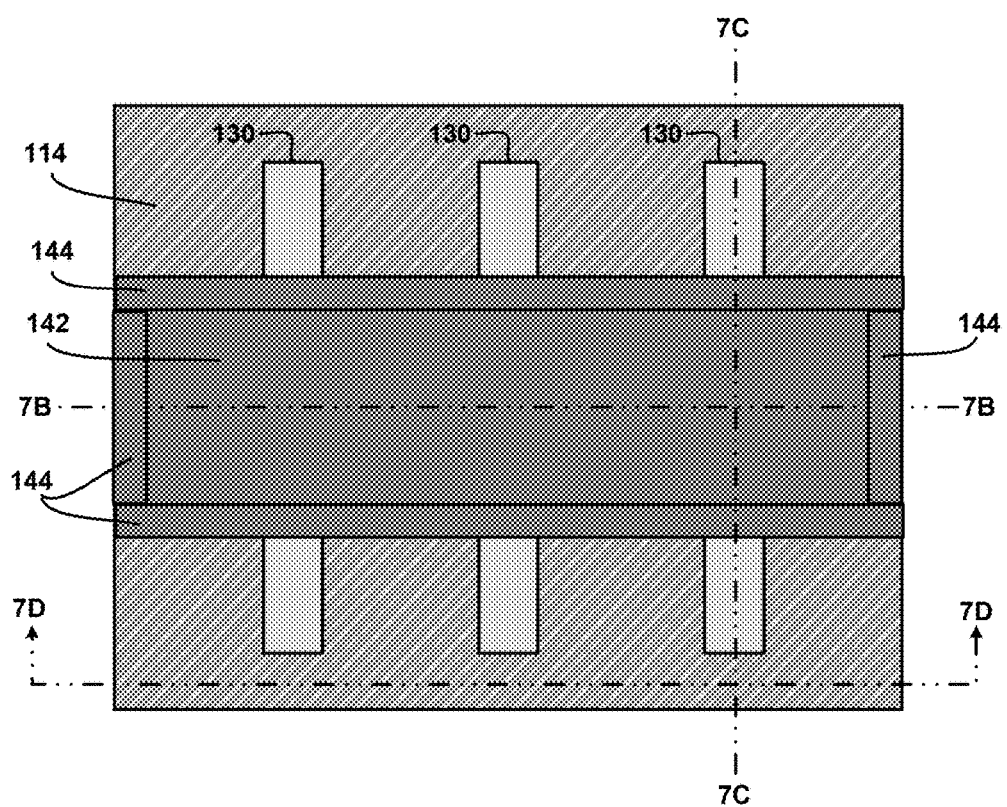
Figure 7B:
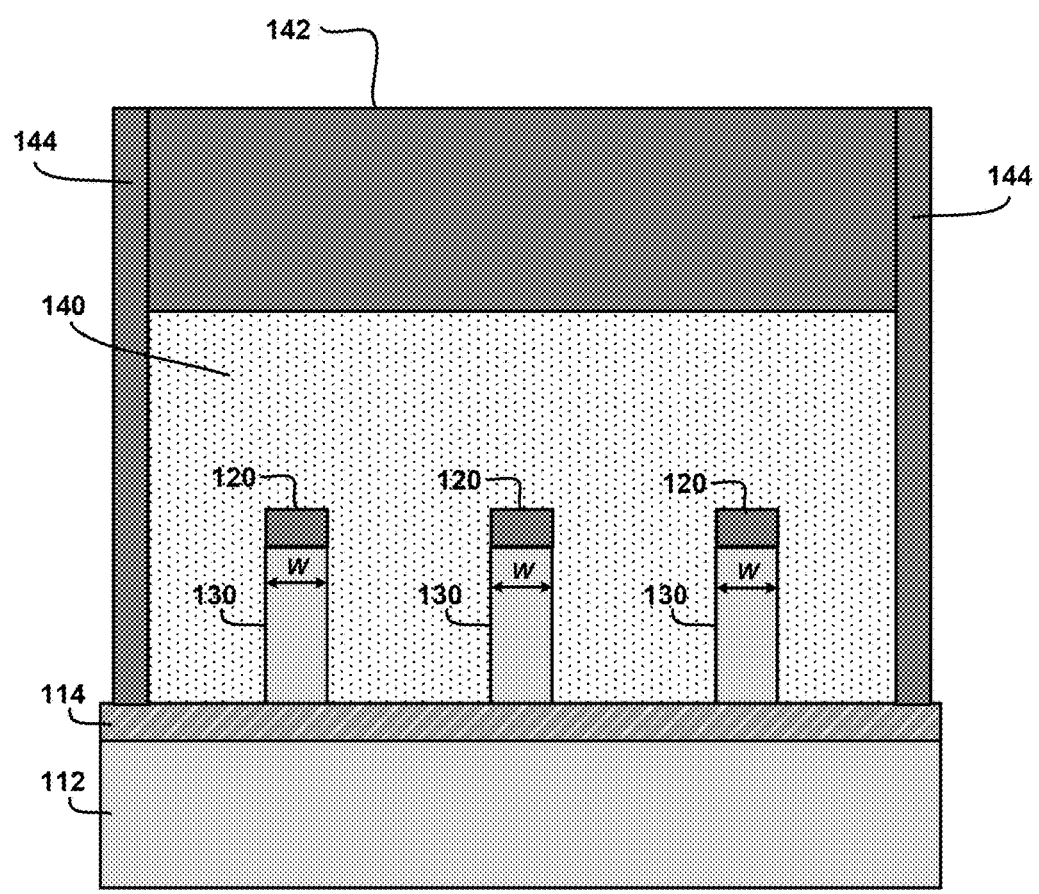
Figure 7C:
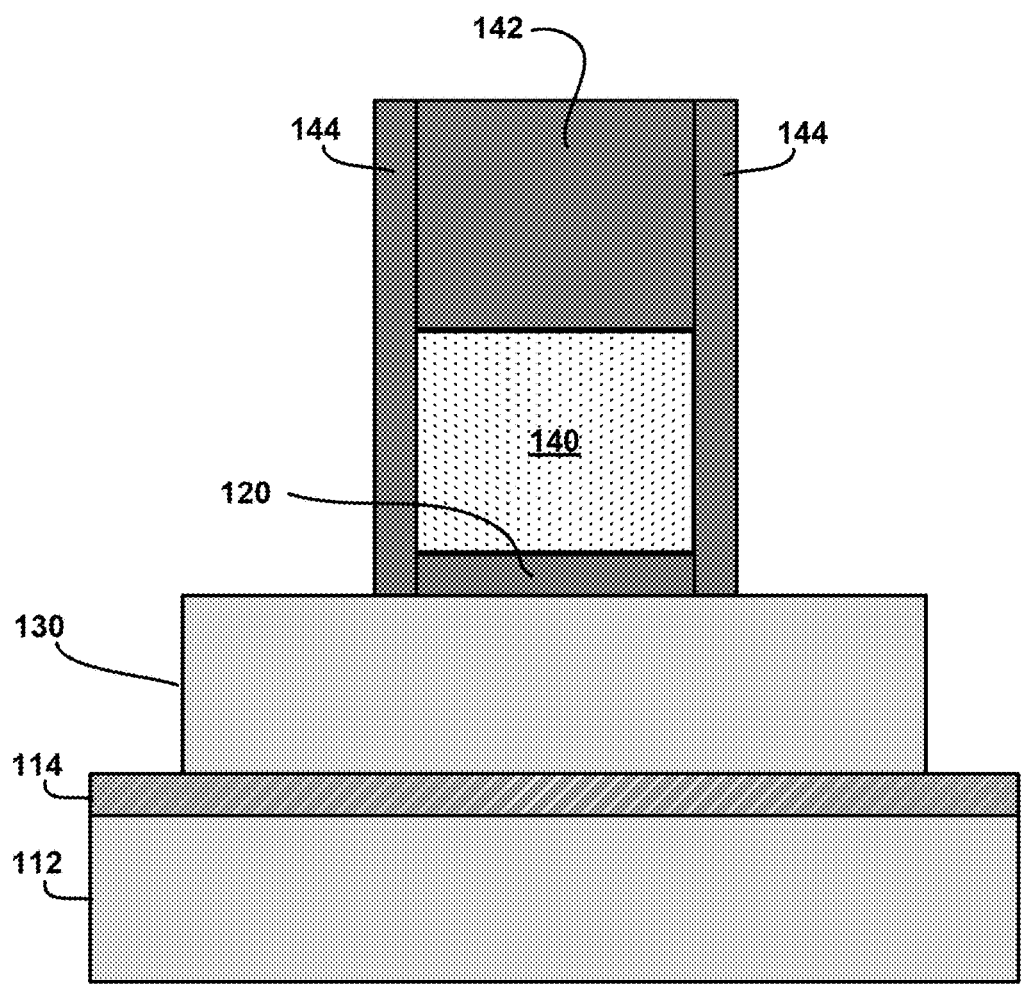
Figure 7D:
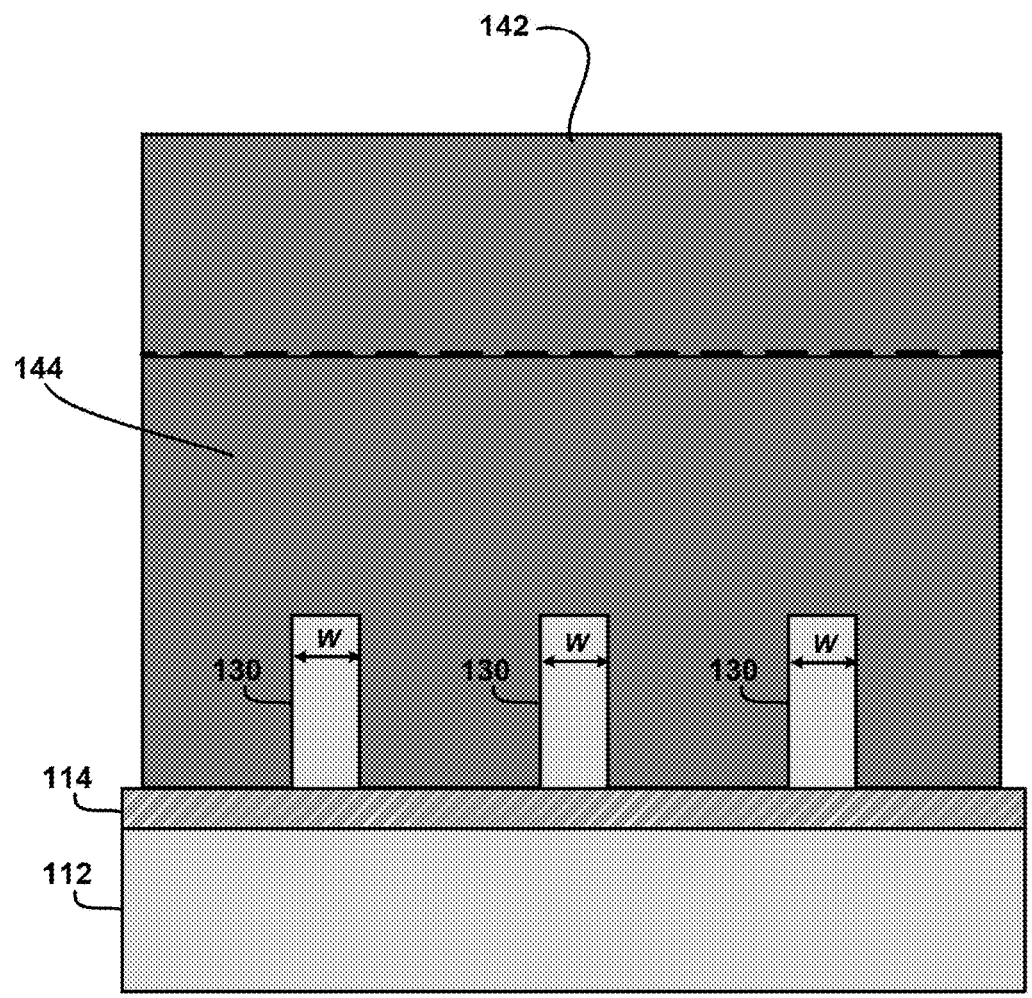

In particular, FIG. 7A is a top plan schematic view of the semiconductor structure shown in FIG. 6A after forming the capping layer 142 on the top of the dummy gate structure 140, and forming the gate sidewall spacers 144 on the vertical sidewalls of the dummy gate structure 140, according to an embodiment of the invention. In addition, FIG. 7B is a cross-sectional schematic view of the semiconductor structure taken along line 7B-7B in FIG. 7A showing the capping layer 142 formed on top of the dummy gate structure 140, and the spacers 144 formed on the end sidewalls of the dummy gate structure 144. Further, FIG. 7C is a cross-sectional schematic view of the semiconductor structure taken along line 7C-7C in FIG. 7A showing the capping layer 142 and gate sidewall spacers 144 formed on sidewalls of the dummy gate structure 140 from which the semiconductor fin structures 130 extend. Moreover, FIG. 7D is a schematic side view of the semiconductor structure as viewed from line 7D-7D in FIG. 7A showing the gate sidewall spacer 142 formed on one side of the dummy gate structure 140.

In one embodiment of the invention, the capping layer 142 and sidewall spacers 144 are formed of an insulating material such as silicon nitride or silicon oxide or other suitable materials. The capping layer 142 and gate sidewall spacers 144 serve to protect the sacrificial material of dummy gate structure 140 during subsequent processing steps. Moreover, the gate sidewall spacers 144 serve to insulate the gate structures from faceted source and drain structures that are formed on the protruding portions of the semiconductor fin structures 130 adjacent the gate sidewalls. Moreover, as shown in FIGS. 7A, 7B, 7C and 7D, the portions of the hard mask layers 120, which are disposed on top of the portions of the semiconductor fin structures 130 not covered by the gate structure, are removed via an etch process that is performed when forming the gate sidewall spacers 144. Again, it is to be noted that for ease of illustration, FIGS. 7A/7B/7C/7D show the dummy gate structure 140 (and encapsulating layers 142/144) formed over three semiconductor fin structures 130. In other embodiments, the dummy gate structure 140 can be formed over more than three semiconductor fin structures 130.

Figure 8A:
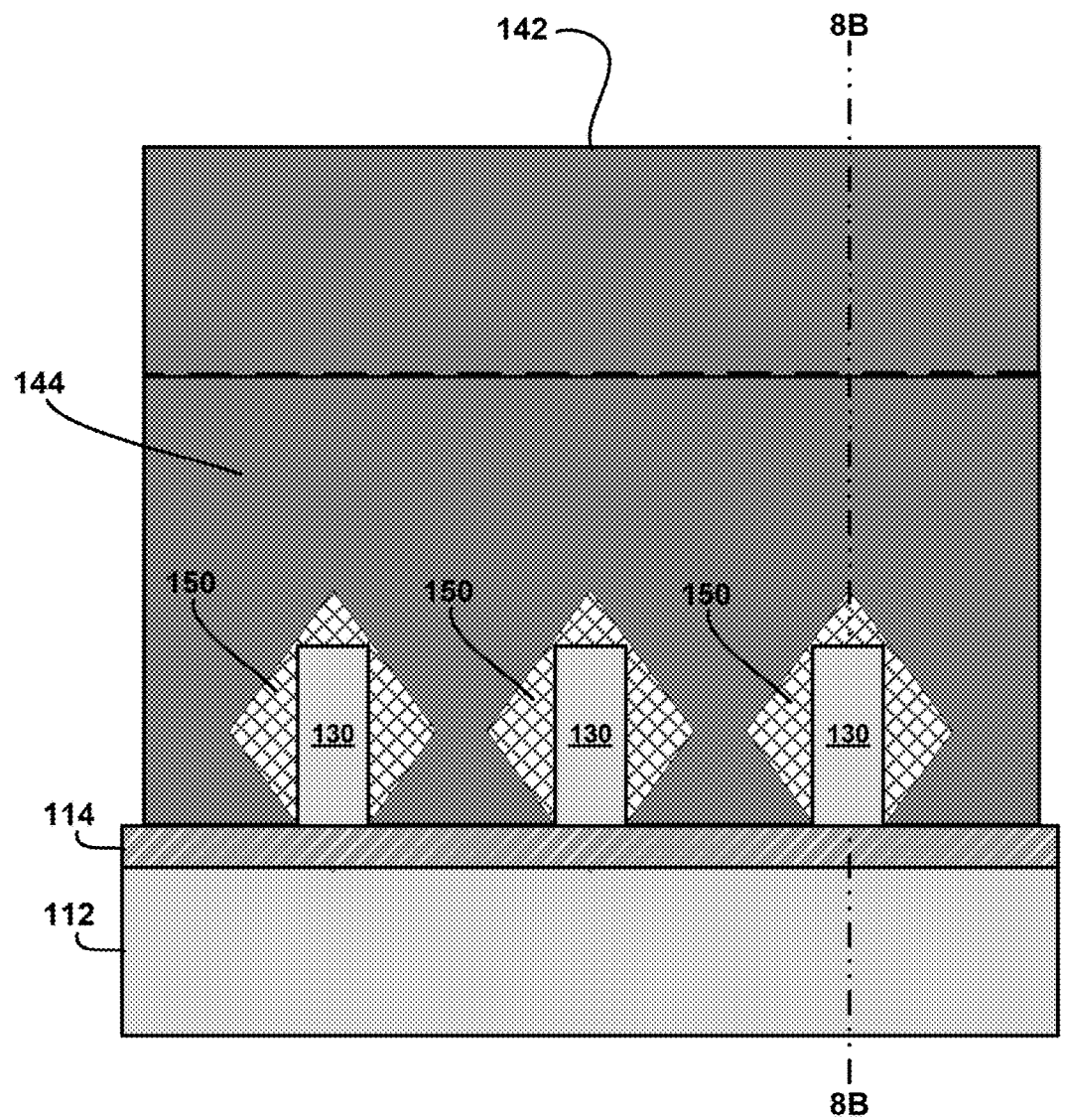
Figure 8B:
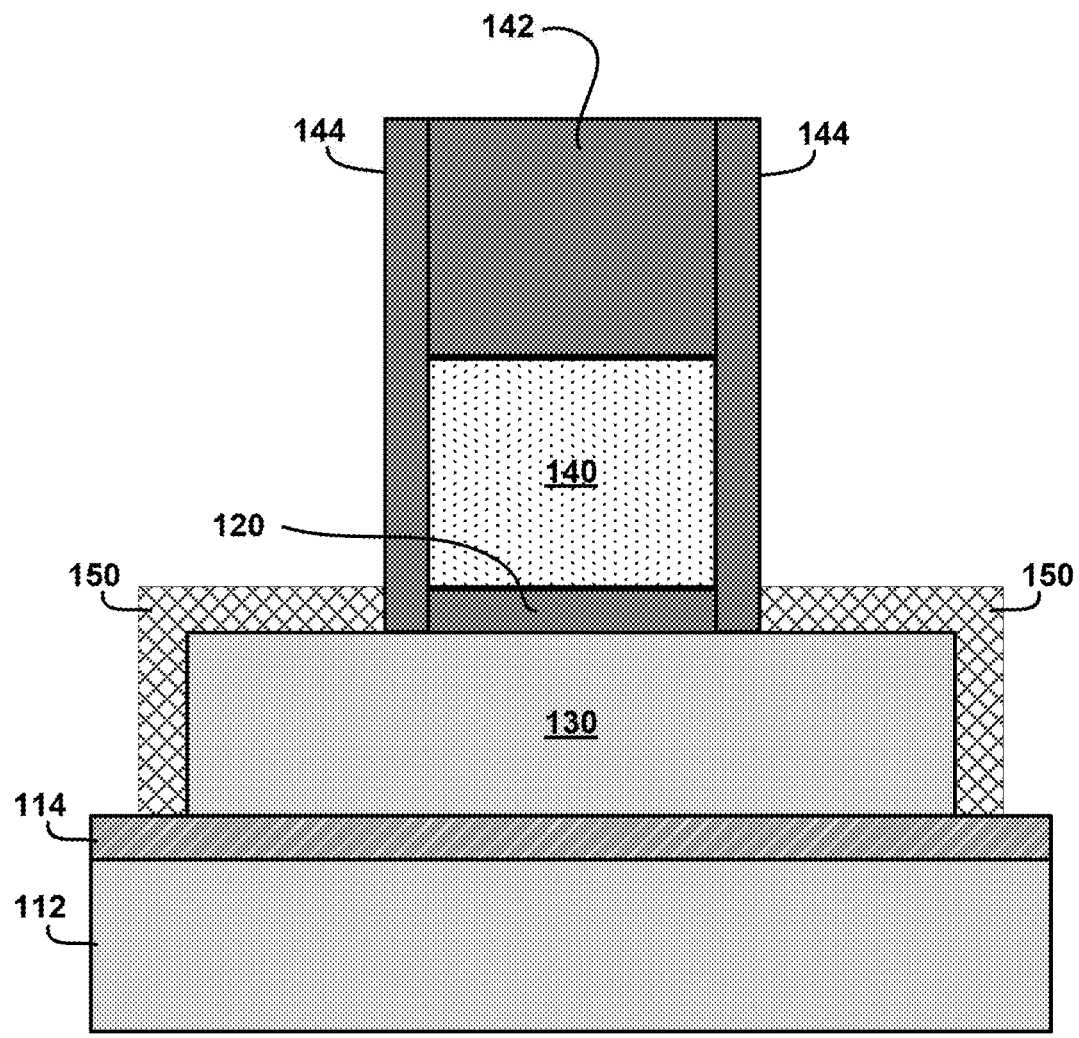

A next step in the exemplary fabrication process comprises forming faceted source and drain regions on the exposed portions of the semiconductor fin structures 130 that are not covered by the dummy gate structure 140. For example, FIGS. 8A and 8B are schematic views of the semiconductor structures shown in FIGS. 7D and 7C, respectively, after performing a source/drain epitaxy process to form faceted source/drain regions 150, according to an embodiment of the invention. In particular, FIG. 8A is view of the semiconductor structure of FIG. 7D showing the formation of diamond-shaped faceted source/drain regions 150 on the exposed portions of the semiconductor fin structures 130 on one side of the dummy gate structure 140. In addition, FIG. 8B is a cross-sectional schematic view of the semiconductor structure taken along line 8B-8B in FIG. 8A, showing the formation of source/drain regions 150 on the exposed portions of one of the semiconductor fin structures 130 extending from each side of the dummy gate structure 140.

In one embodiment of the invention, the faceted source/drain regions 150 are formed by epitaxially growing a doped SiGe layer, for example, on the exposed portions of the semiconductor fin structures 130 using known techniques. The Ge concentration of the SiGe layer can be in a range of about 30% to about 60%. With this epitaxy process, a merging can occur, wherein epitaxial growth of the SiGe layer on the exposed surfaces of the semiconductor fin structures 130 can result in contact of adjacent drain structures 150 and contact of adjacent source structures 150.

In one embodiment of the invention, a selective epitaxy process can be implemented using known techniques in which the process conditions are adjusted such that a growth rate on a surface with a (100) crystallographic orientation is significantly higher than the growth rate on surfaces with (110) or (111) crystallographic orientations. Therefore, the growth rate on the sidewall surfaces of the semiconductor fin structures 130, which may have a (110) crystallographic orientation, is significantly higher than the growth rate on the top surfaces of the semiconductor fin structures 130 which may have a (100) crystallographic orientation. The epitaxial growth may continue until the epitaxial grown layer merges the semiconductor fin structures, or when the epitaxy process is effectively terminated when reaching a (111) surface, thus forming the facets. To increase the difference between the growth rate on (100) surfaces versus (110) and (111) surfaces, a chlorine containing gas such as HCl or $SiH_2Cl_2$ is added to the gases used for the epitaxy process.

In another embodiment, the faceted semiconductor source/drain regions 150 may be formed by epitaxial growth of carbon-doped silicon (Si:C). For example, Si:C may be grown by using a Si containing gas such as $SiH_4$ and a carbon containing gas such as $CH_4$. In one embodiment, a cyclic deposition and etch process can be used to form faceted structure. For example, in a first step, a layer of Si:C is deposited by flowing silicon-containing and carbon-containing gases. In a next step, portions of the deposited layer are etched by flowing an etching gas, for example, HCl gas. These steps are repeated for a number of cycles until the desired thickness of the faceted source/drain regions 150 is obtained. Process conditions such as the time for deposition and etch steps may be adjusted to obtain (111) facets.

In some embodiments, the faceted source/drain regions 150 may be in-situ doped during epitaxial growth by adding a dopant gas to the source deposition gas (i.e., the Si-containing gas). Exemplary dopant gases may include a boron-containing gas such as $BH_3$ for pFETs or a phosphorus or arsenic containing gas such as $PH_3$ or $AsH_3$ for nFETs, wherein the concentration of impurity in the gas phase determines its concentration in the deposited film.

Figure 9A:
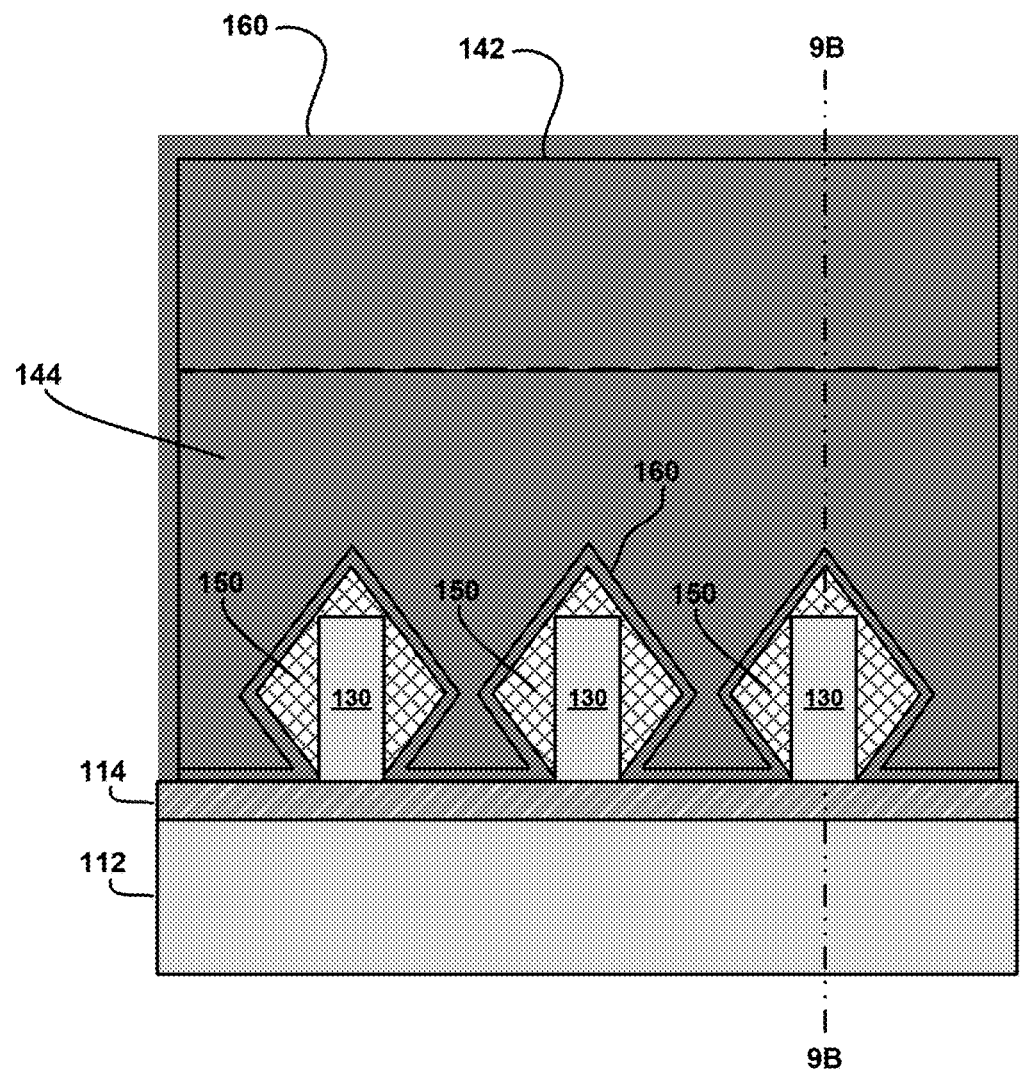
Figure 9B:
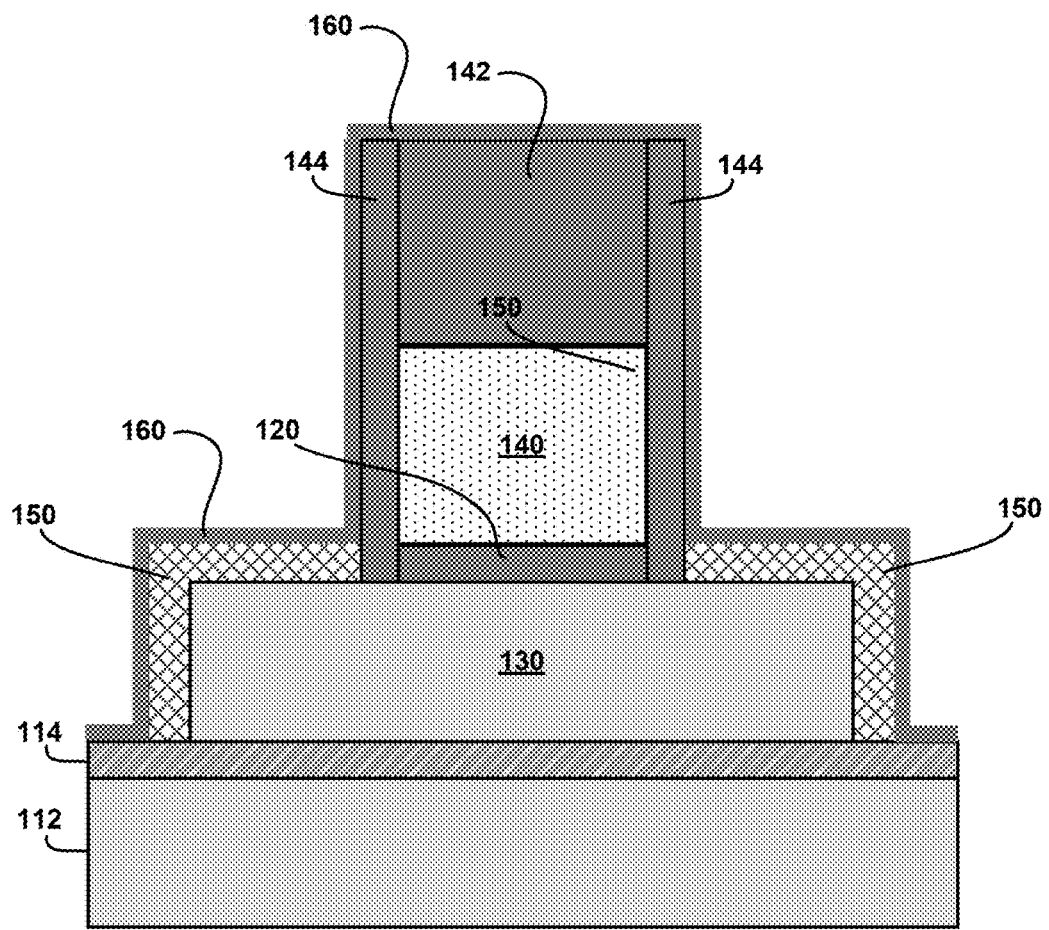

Following formation of the epitaxial source/drain regions 150, a next step comprises depositing a liner layer to protect the epitaxial source/drain regions 150 from further processing steps. For example, FIGS. 9A and 9B are schematic views of the semiconductor structures of FIGS. 8A and 8B, respectively, after forming a liner layer 160 over the semiconductor structure, according to an embodiment of the invention. FIG. 9B is a cross-sectional schematic view of the semiconductor structure taken along line 9B-9B in FIG. 9A. In one embodiment of the invention, the liner layer 160 comprises a conformal layer of insulating material, such as silicon nitride, which is deposited using known techniques.

Figure 10:
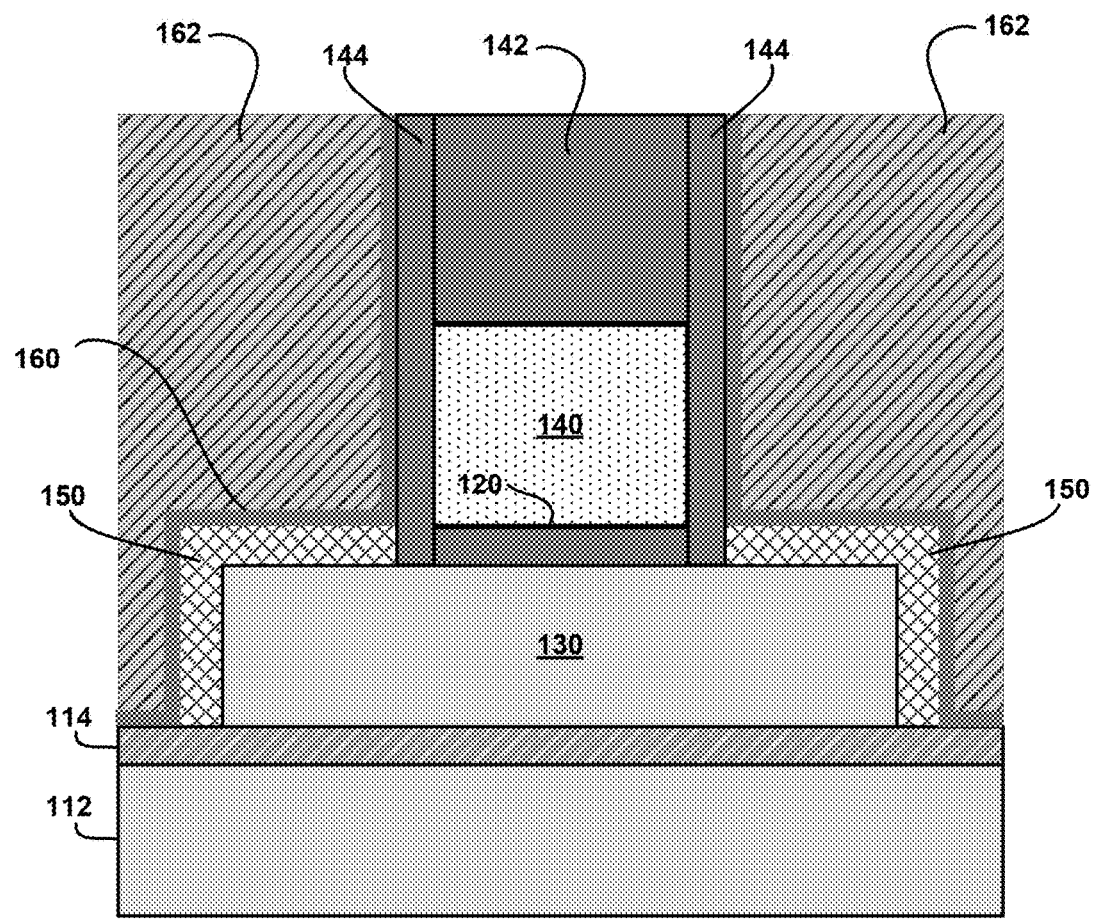
FIG. 10 is a schematic view of the semiconductor structure after blanket depositing an insulating layer over the semiconductor structure and planarizing the insulating layer, according to an embodiment of the invention.

A next step in the exemplary fabrication process comprises blanket depositing a layer of dielectric/insulating material over the semiconductor structure of FIGS. 9A and 9B, and etching the blanket layer of dielectric material down to the capping layer 142 of the gate structure. For example, FIG. 10 is a schematic view of the semiconductor structure shown in FIG. 9B after depositing a layer of dielectric/insulating material 162, and etching the dielectric/insulating layer 162 down to the capping layer 142 of the gate structures, according to an embodiment of the invention. In one embodiment of the invention, the dielectric/insulating layer 162 may be formed of any suitable material such as, e.g., silicon oxide, silicon nitride, hydrogenated silicon carbon oxide, silicon based low-k dielectrics, porous dielectrics, or organic dielectrics including porous organic dielectrics. In addition, the dielectric/insulating layer 162 may be formed using known suitable deposition techniques, such as, for example, atomic layer deposition (ALD), chemical vapor deposition (CVD), plasma enhanced chemical vapor deposition, spin on deposition, or physical vapor deposition (PVD). In one embodiment, the dielectric/insulating layer 182 may be etched using a standard planarization process such as chemical-mechanical planarization (CMP), wherein the surface of the semiconductor structure is planarized to expose the capping layer 142 on top of the dummy gate structure 140.

Figure 11A:
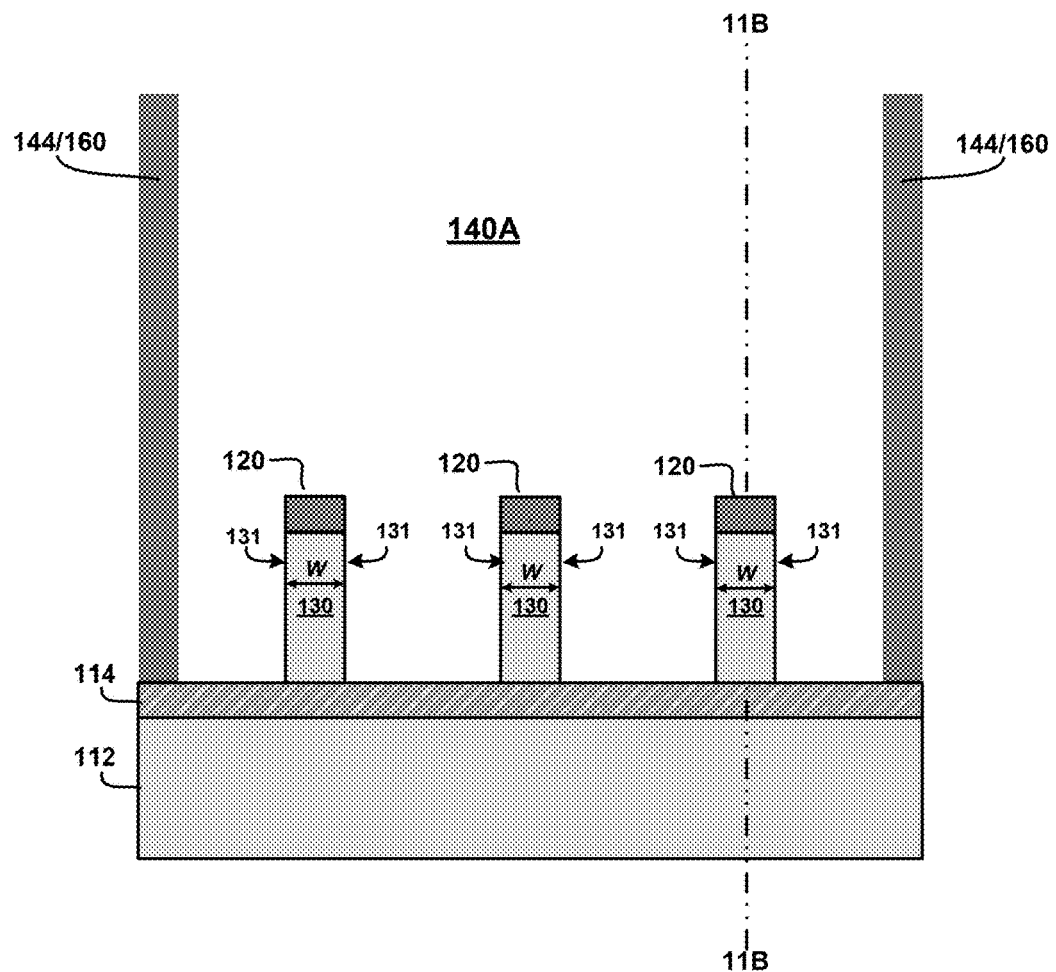
Figure 11B:
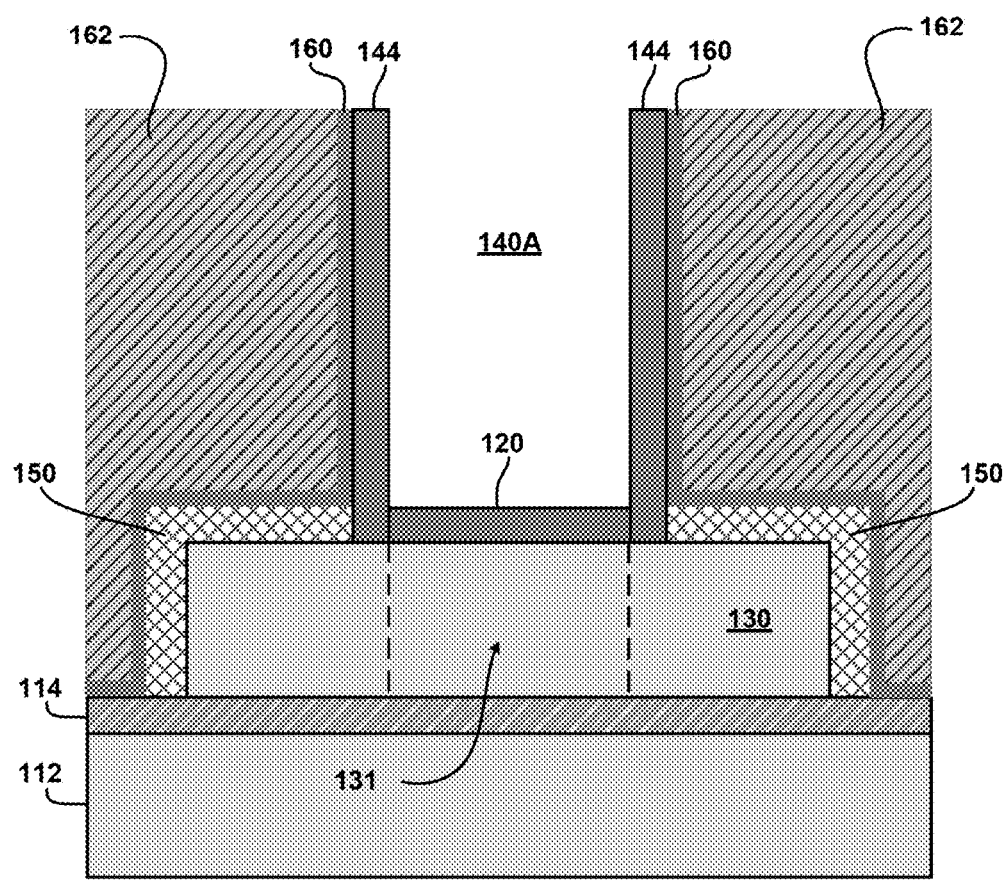

Following planarization of the dielectric/insulating layer 162, a sequence of etching steps are performed to remove the sacrificial material forming the dummy gate structure 140. For example, FIGS. 11A and 11B are schematic views of the semiconductor structure after removing the capping layer 142 and the sacrificial polysilicon gate material forming the dummy gate structure 140, according to an embodiment of the invention. FIG. 11B is a cross-sectional schematic view of the semiconductor structure taken along line 11B-11B in FIG. 11A.

For example, in one embodiment of the invention, an etch mask (e.g., photoresist mask) can be formed over the top surface of the semiconductor structure, which has a pattern that exposes the capping layer 142. The capping layer 142 can then be etched away using any suitable etch chemistry and etch process to remove the capping layer 142 and expose the sacrificial material (e.g., polysilicon) forming the dummy gate structure 140. Another etch process is then performed to remove the sacrificial material of the dummy gate structure 140 and form a recessed gate region 140A which exposes the hard mask layers and 120 and portions semiconductor fin structures 130 within the recessed gate region 140A. The etch process to remove the sacrificial material of the dummy gate structure 140 is performed selective to the materials of the hard mask layers 120 and the semiconductor fin structures 130, so as to avoid etching such elements 120 and 130. Such etching processes may include anisotropic etching processes such as RIE or plasma etching.

As shown in FIGS. 11A and 11B, the result of the dummy gate removal process is to remove the sacrificial gate material in the gate region (originally defined by the dummy gate structure 140) and expose sidewall surfaces 131 of the portions of the semiconductor fin structures 130 within the recessed gate region 140A. The exposed portions of the semiconductor fin structures 130 (which are disposed within the recessed gate region 140A) comprise channel regions of FETs, wherein the channel regions are further processed (as discussed below) to form the semiconductor fin channel structures 180. In one embodiment of the invention, the sidewalls 131 of the semiconductor fin structures 130 have a (110) crystal orientation. As further shown in FIG. 11A, the portions of the semiconductor fin structures 130 that are exposed within the recessed gate region 140A have the original width W.

Figure 12A:
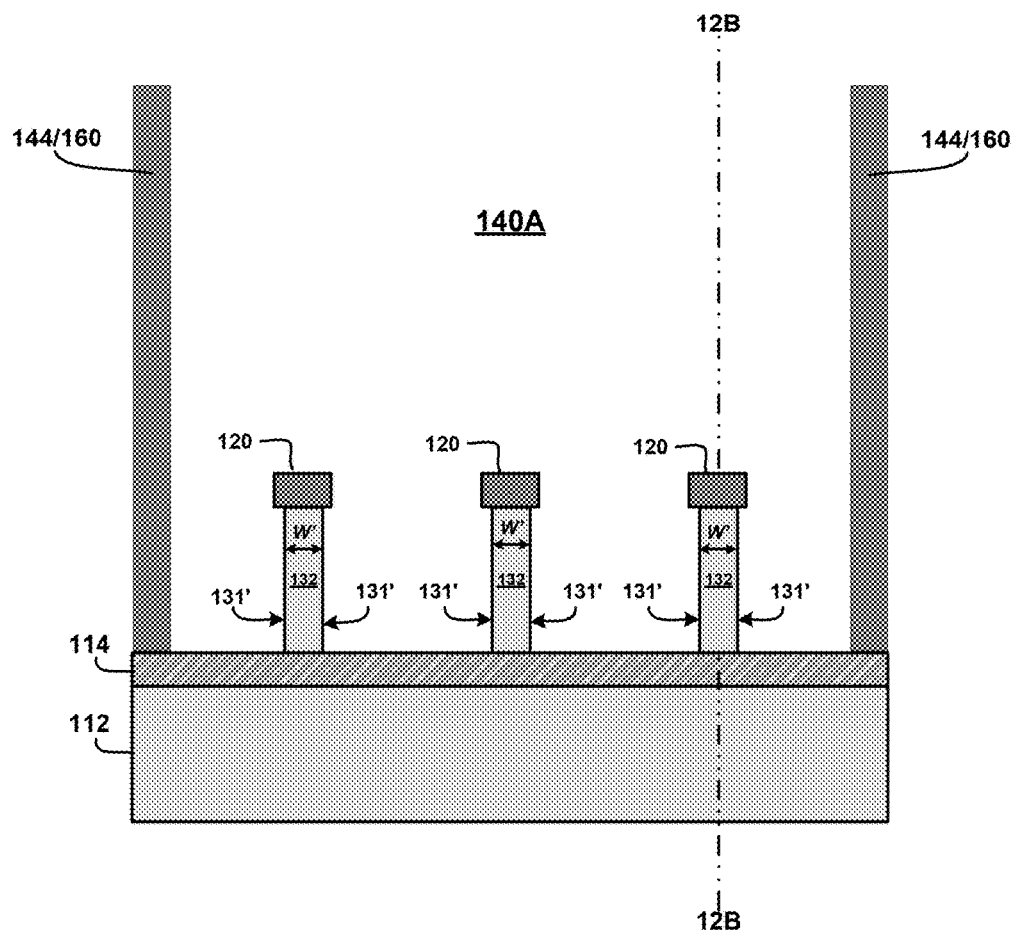
Figure 12B:
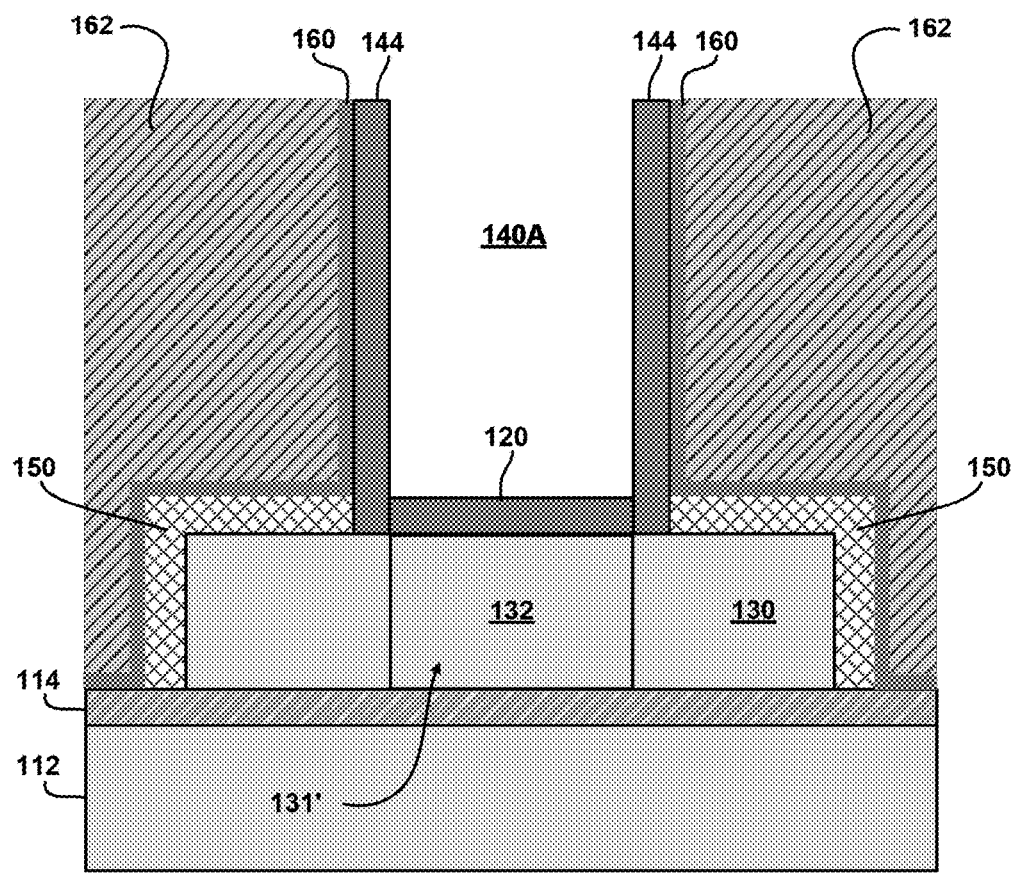

Following removal of the dummy gate structure 140, a next step in the exemplary fabrication process comprises etching the exposed sidewalls 131 of the semiconductor fin structures 130 to form the thinned portions 132 of the semiconductor fin structures 130 within the recessed gate region 140A. For example, FIGS. 12A and 12B are schematic views of the semiconductor structures of FIGS. 11A and 11B, respective after etching the exposed sidewalls 131 of the semiconductor fin structures 130 within the recessed gate region 140A to form recessed sidewalls 131', according to an embodiment of the invention. The recessed sidewalls 131' define the thinned portions 132 of the semiconductor fin structures 130. In particular, as specifically shown in FIG. 12A, the distance between the recessed (etched) sidewalls 131' defines a width W' of the thinned portions 132 of the semiconductor fin structures 130, which is less than the original width W (i.e., W'<W) of the semiconductor fin structures 130 and hard mask layers 120. In addition, as further shown in FIG. 12A, the width W of the hard mask layers 120 essentially remain the same, so that the hard mask layers 120 remain wider than the thinned portions 132 of the semiconductor fin structures 130 within the recessed gate region 140A.

In one embodiment of the invention, the exposed sidewall surfaces 131 of the semiconductor fin structures 130 can be etched using a process comprising (i) oxidizing the exposed sidewall surfaces 131 to form a thin oxide layer on each sidewall surface 131, and (ii) removing (via etching) the thin oxide layers to form the thinned portions 132 of the semiconductor fin structures 130. This process results in the exposed portions of the semiconductor fin structures 130 within the recessed gate region 140A being etched to have thinner profiles (W'<W), wherein the etching causes a recessing of the exposed sidewalls 131 to form the recessed sidewalls 131'.

In one embodiment, the oxidation process is performed using a low-temperature plasma-assisted oxidation process, with an oxygen plasma stream generated using known techniques and other precursors (inert gases) such as nitrogen or argon. When the sidewall surfaces 131 of the semiconductor fin structures 130 have a (110) crystal orientation, the oxidation process is performed at double (2x) the rate as compared to oxidation of (100) or (111) surfaces. The thin oxide layers formed on the sidewalls 131 of the semiconductor fin structures 130 can be removed using known etching chemistries and techniques.

In one embodiment of the invention, wherein the original width W of the semiconductor fin structures 130 is in a range of about 6 nm to about 15 nm, an oxidation process is performed to oxidize the sidewall surfaces 131 of the semiconductor fin structures 130 to a distance about 1 nm to 2 nm within the material of the sidewall surfaces 131. In this regard, the thinning process can result in the removal of at least 1 nm to 2 nm in material thickness from each sidewall 131 of the semiconductor fin structures 130, resulting in the formation of the recessed sidewalls 131' which define the width W' profiles of the thinned portions 132 of the semiconductor fin structures 130.

In another embodiment of the invention, the sidewall etch process can be performed using an in-situ diluted HCL etch process, in which the amount of sidewall material etched away is controlled by a timed etch. In another embodiment, the sidewall etch process can be implemented using a wet oxidation process following and wet etch process, using known etching solutions and techniques to oxidize the material forming the semiconductor fin structures 130 and remove the oxidized material.

Figure 13A:
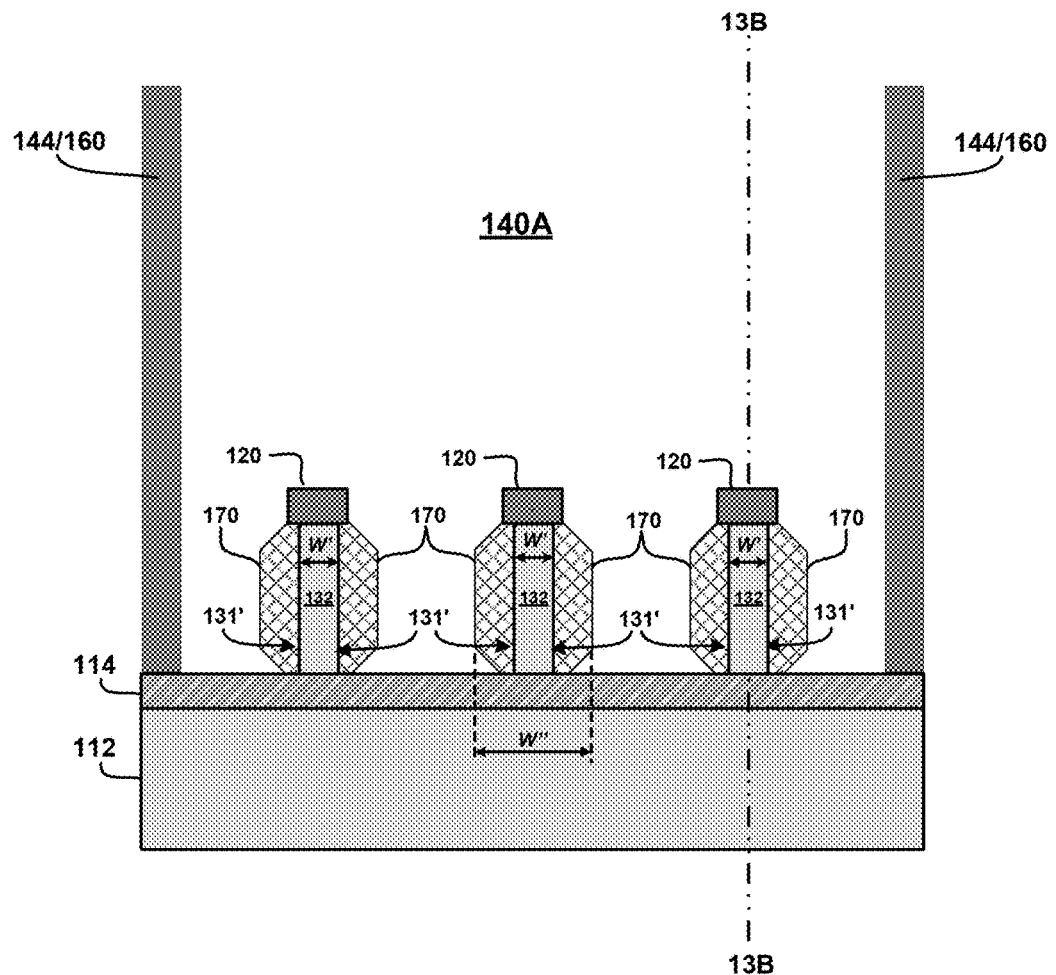
Figure 13B:
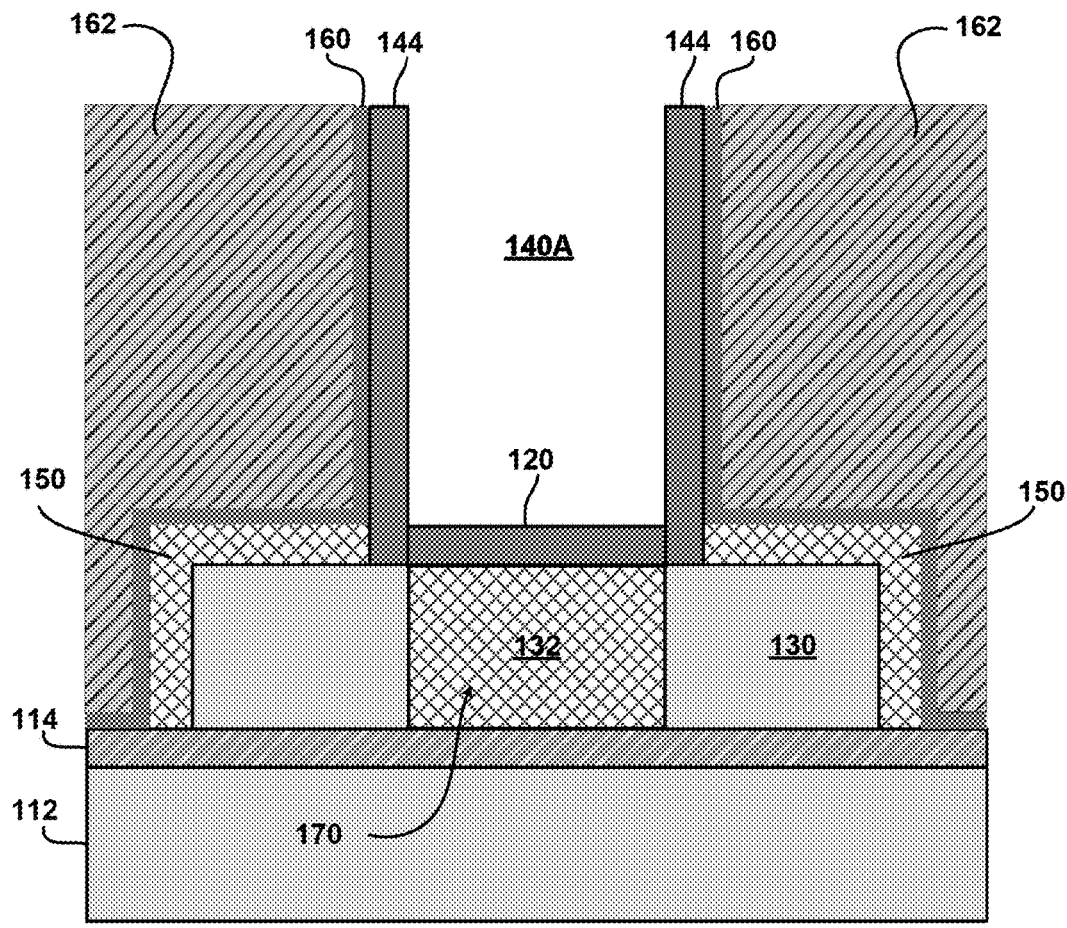

A next step in the exemplary fabrication process comprises growing a layer of semiconductor alloy material, such as a silicon-germanium alloy layer, on the recessed sidewalls 131' of the thinned portions 132 of the semiconductor fin structures 130. For example, FIGS. 13A and 13B are schematic views of the semiconductor structures shown in FIGS. 12A and 12B, respectively, after growing semiconductor alloy layers 170 on the recessed sidewalls 131' of the thinned portions 132 of the semiconductor fin structures 130, according to an embodiment of the invention. In one embodiment of the invention, the semiconductor alloy layers 170 are formed by epitaxially growing faceted SiGe layers on the recessed sidewalls 131' of the thinned portions 132 of the semiconductor fin structures 130. In one embodiment of the invention, the semiconductor alloy layers 170 are formed with a high-concentration of Ge material in a range of about 50% to about 75%.

During the epitaxy growth process (e.g., SiGe epitaxy), the semiconductor alloy layers 170 are formed on the recessed sidewalls 131' with non-uniform thickness. For example, assuming that the recessed sidewalls 131' are (110) surfaces, the semiconductor alloy material (e.g. SiGe material) epitaxially grown on the recessed sidewalls 131' form trapezoidal or diamond-shaped structures, for example, with non-uniform thickness. The epitaxy process proceeds until the resulting channel structure 132/170 has a width W" which is greater than the original width W (i.e., W">W) of the mask layers 120 (and semiconductor fin structures 130) and/or until enough semiconductor alloy material (e.g., SiGe) is grown on the recessed sidewalls 131' to replace the amount (in thickness) of the original semiconductor material that was oxidized and etched away from the sidewalls 131 of the semiconductor fins structures 130 during the previous process step (e.g., FIG. 12A).

After the non-uniform semiconductor alloy layers 170 (e.g., facetted SiGe layers) are formed, an etch process is performed using the hard mask layers 120 as etch masks to remove an excess amount of material of the semiconductor alloy layers 170 (e.g., excess material of the faceted SiGe layers) which extends past the hard mask layers 120, and thereby form planarized semiconductor alloy layers 172 (e.g., planar SiGe layers) with uniform thickness on the recessed sidewalls 131' of the thinned portions 132 of the semiconductor fin structures 130.

Figure 14A:
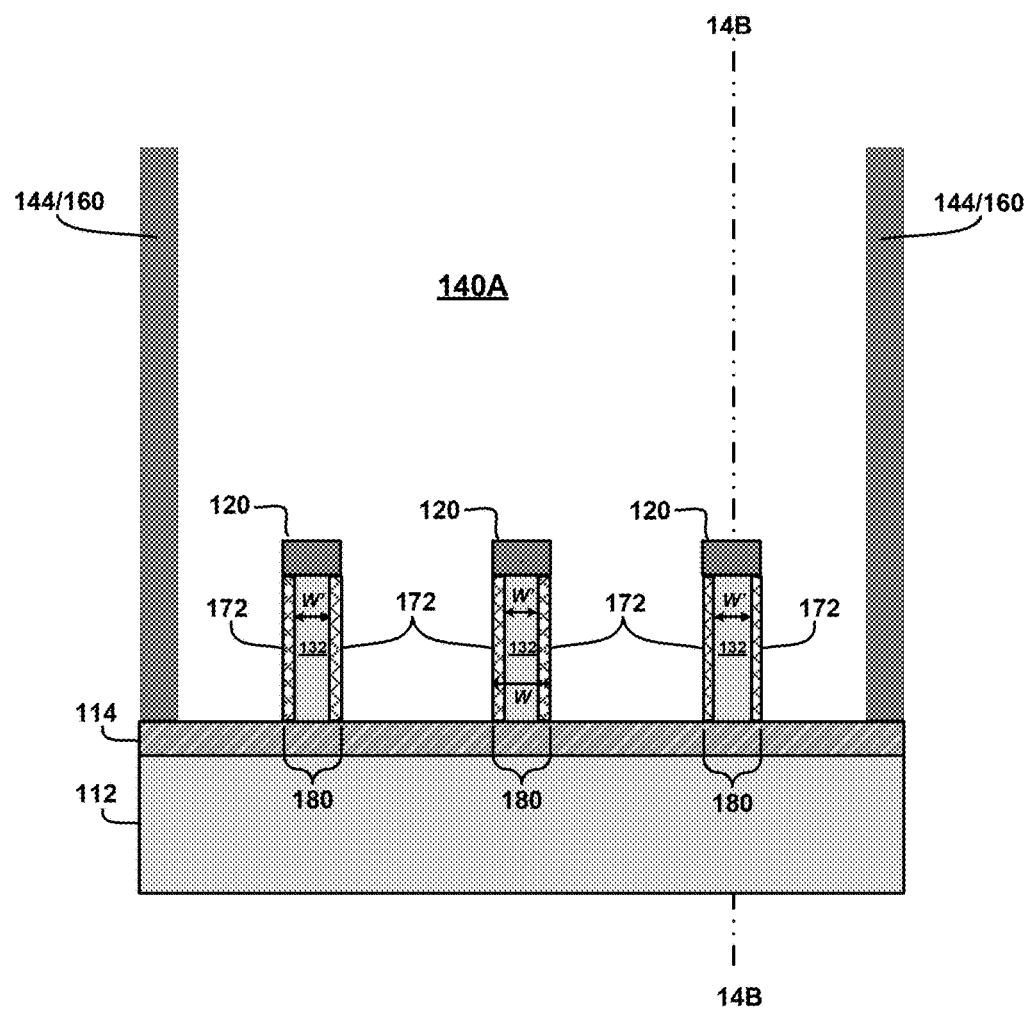
Figure 14B:
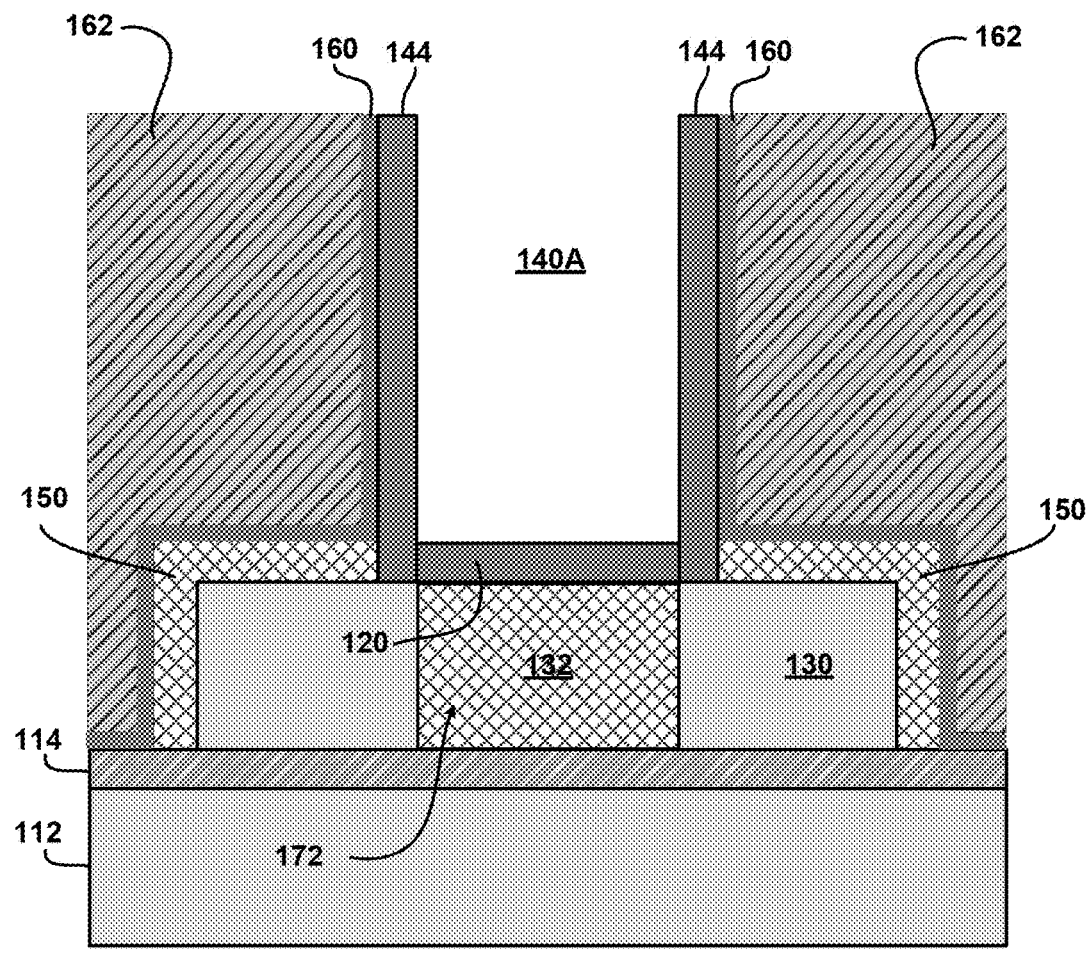

For example, FIGS. 14A and 14B are schematic views of the semiconductor structures of FIGS. 13A and 13B, respectively, after etching the facetted semiconductor alloy layers 170 to form the planar semiconductor alloy layers 172 (with uniform thickness) on the recessed sidewalls 131' of the thinned portions 132 of the semiconductor fin structures 130, according to an embodiment of the invention. In one embodiment of the invention the facetted semiconductor alloy layers 170 are etched using an anisotropic RIE process, for example, which etches the semiconductor alloy material (e.g., SiGe material) selective to the material (e.g., nitride)

of the hard mask layers 120, and which selectively etches the semiconductor alloy material of the layers 170 in a direction normal to the surface of the hard mask layers 120. This process etches the excess material of the semiconductor alloy layers 170 which is not covered by hard mask layers 120 and, thus, essentially planarizes the facetted surface of the semiconductor alloy material to form the planar semiconductor alloy layers 172 (with uniform thickness) on the recessed sidewalls 131' of the thinned portions 132 of the semiconductor fin structures 130 within the recessed gate region 140A.

As shown in FIG. 14A, by using the hard mask layers 120 as etch masks, the resulting channel fin structures 180, which are formed within the recessed gate region 140A, comprise thin planar semiconductor alloy channel layers 172 (e.g., about 1-2 nm in thickness) formed on tall semiconductor fins (e.g., the thinned portions 132), wherein the channel fin structures 180 have a total width that is substantially equal to the original width W of the non-thinned semiconductor fin structures 130. As noted above, this process enables a thin silicon germanium film (e.g., 3-4 nm) with high-percentage Ge (about 50% or more) to be epitaxially grown (without defects) on the sidewalls of tall silicon semiconductor fin structures (e.g., heights of about 30 nm or more), while using the hard mask layers 120 to anisotropically etch away the excess SiGe material (e.g., facetted SiGe portions which form a trapezoid or diamond structure) and form SiGe channel layers 172 on tall fin structures (e.g., thinned portions 132), wherein the SiGe channel layers 172 have uniform thickness. Moreover, this process enables the formation of uniform-shaped channel fin structures 180, which enhances device performance.

Figure 15A:
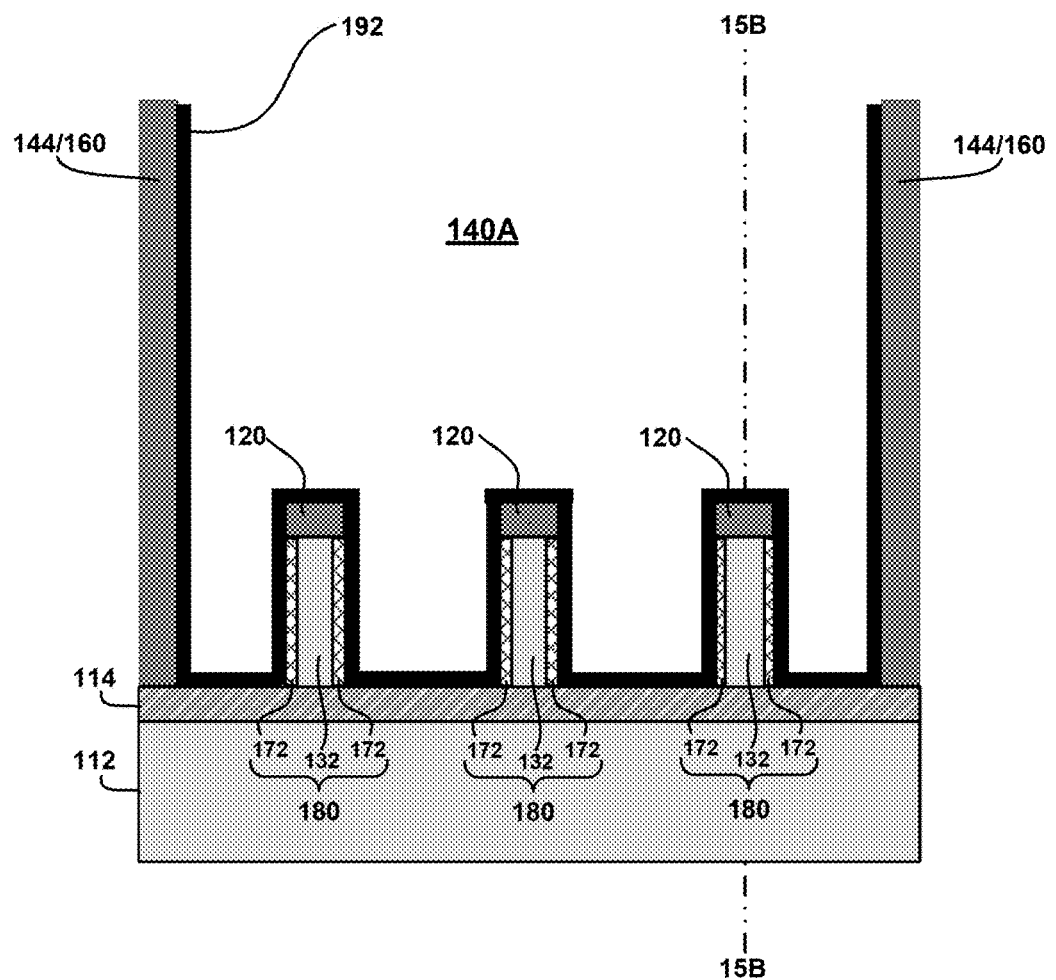
Figure 15B:
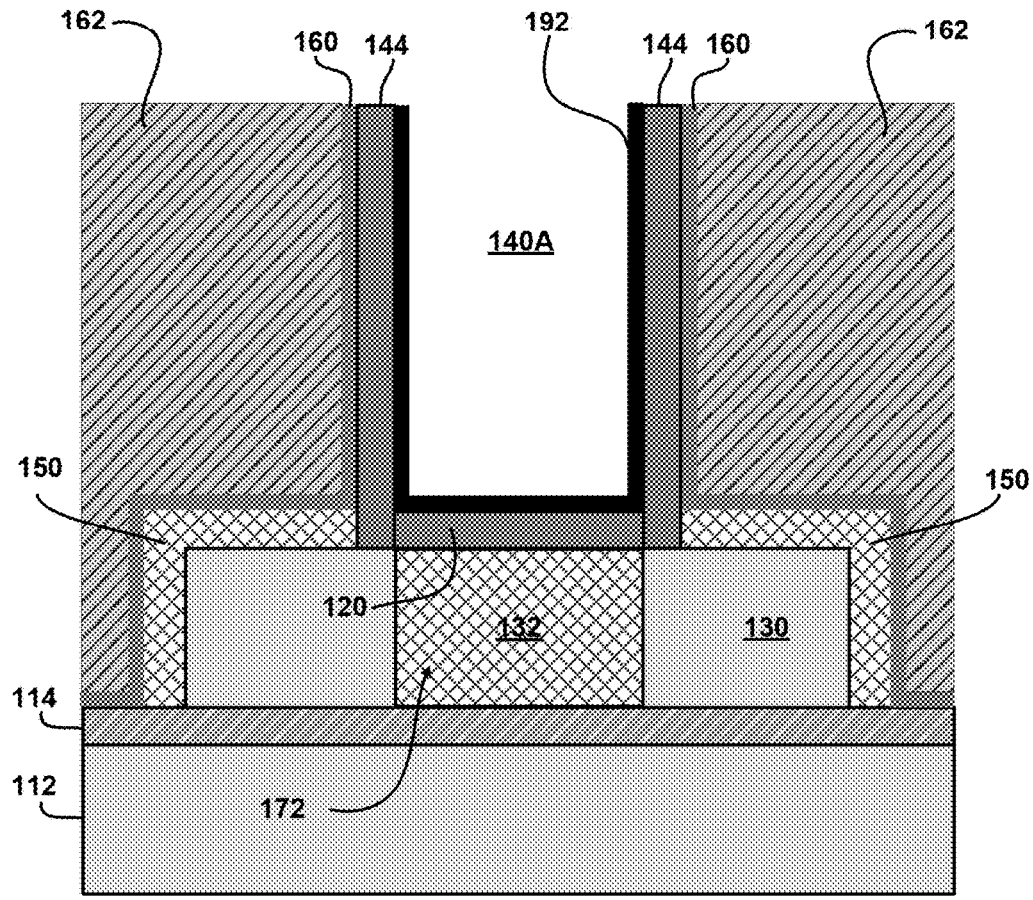

Following formation of the, e.g., SiGe channel layers 172, a replacement metal gate process is performed to construct the replacement gate structure 190 (shown in FIG. 1) comprising the gate dielectric layer 192, the work function metal layer 194, and the metal electrode 196, using methods as discussed below. For example, FIGS. 15A and 15B are schematic views of the semiconductor structures of FIGS. 14A and 14B, respectively, after forming the gate dielectric layer 192 within the gate region of the FinFET device, according to an embodiment of the invention. The gate dielectric layer 192 can be formed of any insulating material which is suitable to serve as a gate dielectric layer for the target application. For example, the gate dielectric layer 192 may comprise, e.g., nitride, oxynitride, or oxide or high-k materials such as $SiO_2$, $HfO_2$, $ZrO_2$, $Al_2O_3$, $TiO_2$, $La_2O_3$, $SrTiO_3$, $LaAlO_3$, and mixtures thereof. In one embodiment of the invention, the gate dielectric layer has a thickness in a range of about 0.5 nm to about 10 nm, which will vary depending on the target application. The gate dielectric layer 192 can be formed using known methods such as ALD, CVD, PVD, or MBD, for example.

Figure 16A:
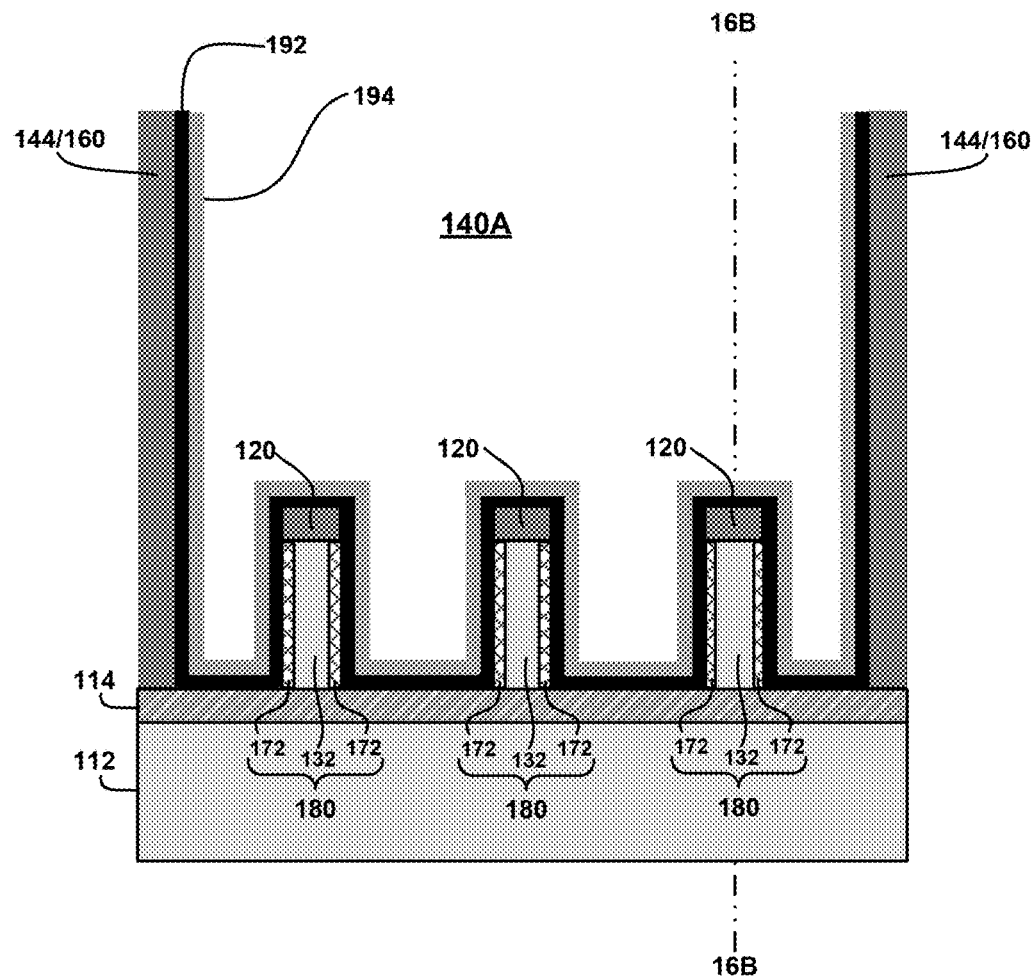
Figure 16B:
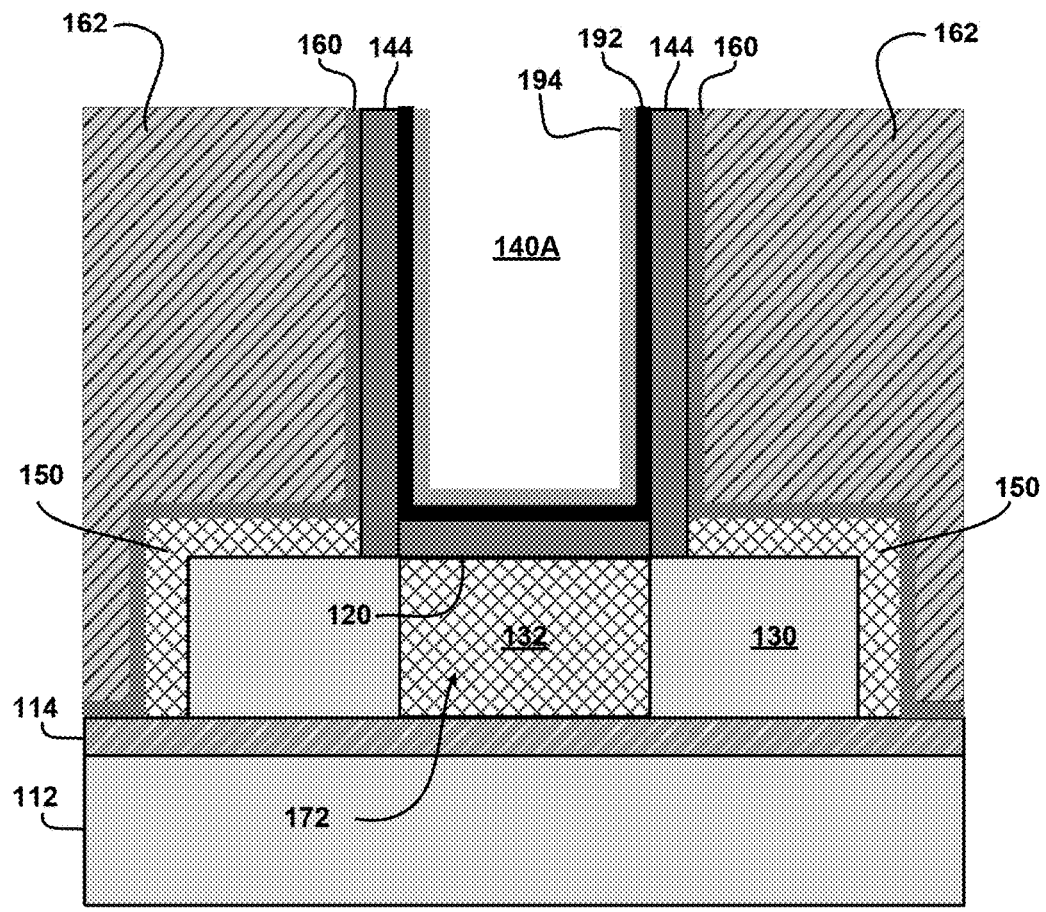

Next, FIGS. 16A and 16B are schematic views of the semiconductor structures shown in FIGS. 15A and 15B, respectively, after forming a work function metal layer 194 (or metallic gate layer 194) within the recessed gate region 140A, according to an embodiment of the invention. The metallic gate layer 914 may be formed using any material which is suitable to serve as a metallic gate layer for the target application. For example, the metallic gate layer 192 may comprise, for example, Zr, W, Ta, Hf, Ti, Al, Ru, Pa, metal oxides, metal carbides, metal nitrides, transition metal aluminides (e.g. $Ti_3Al$, ZrAl), TaC, TiC, TaMgC, or any combination thereof. The metallic gate layer 194 can be formed using known methods such as ALD, CVD, PVD, or MBD, for example.

Figure 17A:
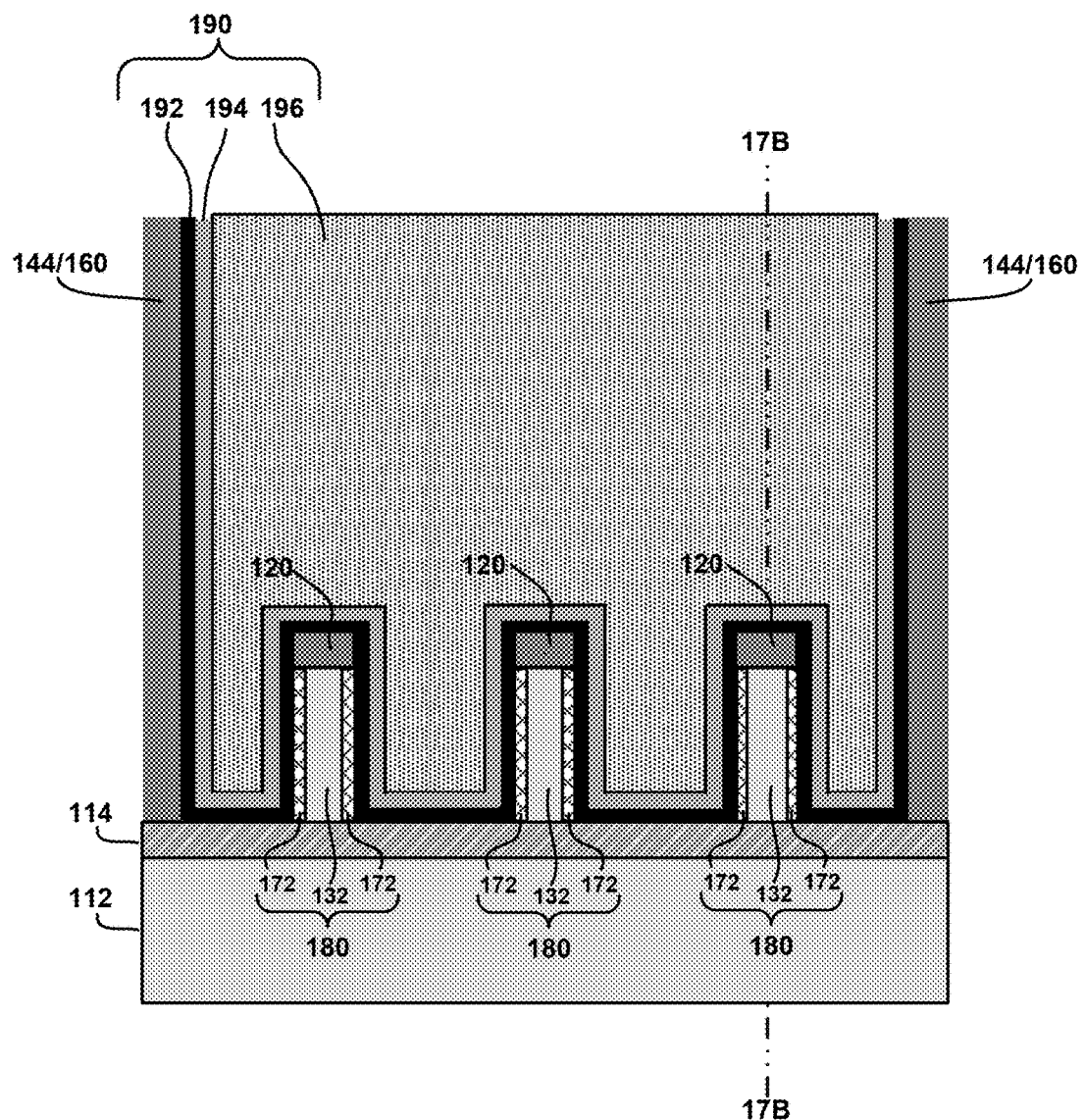
Figure 17B:
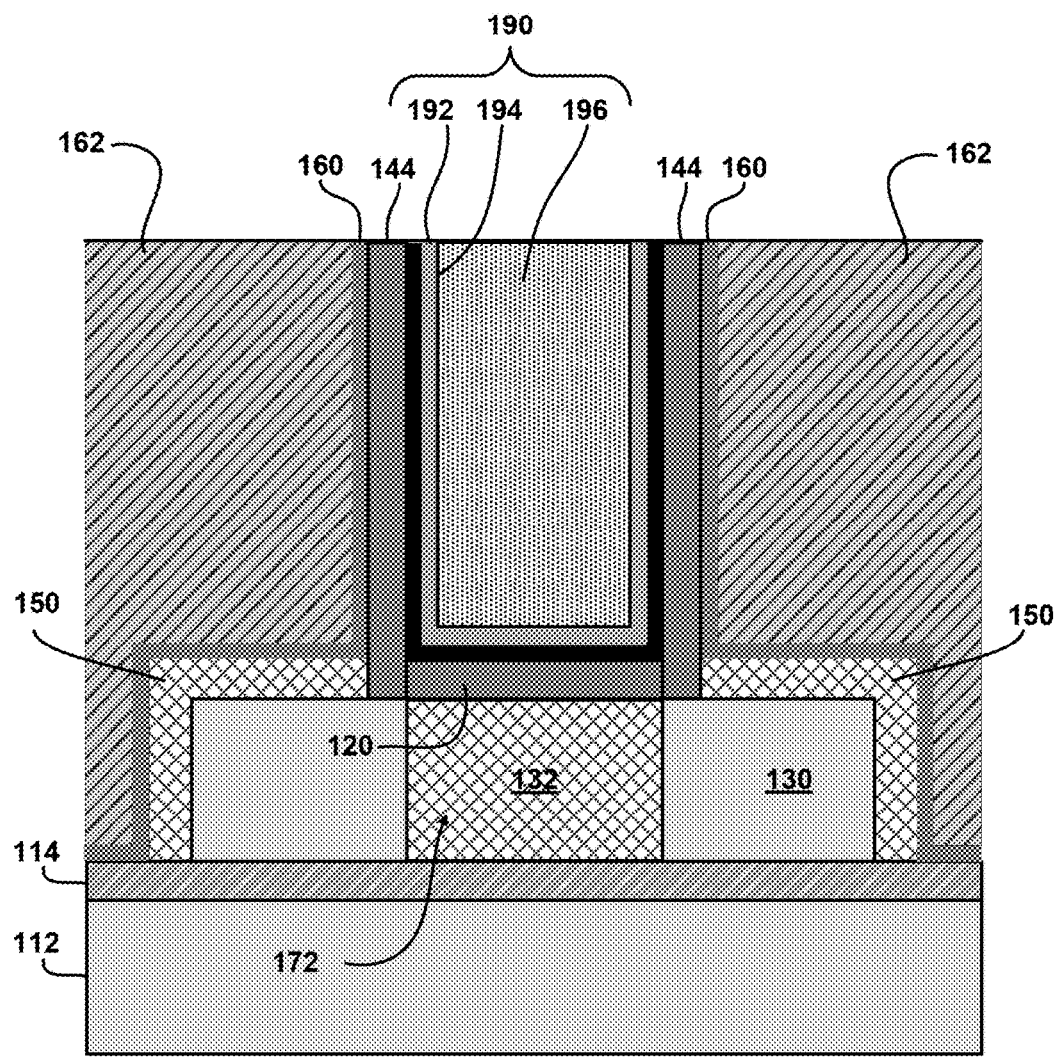

Next, FIGS. 17A and 17B are schematic views of the semiconductor structures shown in FIGS. 16A and 16B, respectively, after forming the metallic gate contact 196 within the recessed gate region 140A, according to an embodiment of the invention. FIG. 17B is a cross-sectional schematic view of the semiconductor structure taken along line 17B-17B in FIG. 17A. The metallic gate contact 196 can be formed of any metallic or conductive material that is commonly used to make contact plugs. For example, the gate contact 196 can be formed of tungsten. In another embodiment, the gate contact 196 can be formed using doped polysilicon material.

Following the formation of the replacement gate structure 190, any standard sequence of processing steps can be implemented to complete the fabrication of the n-type and/or p-type FinFET devices and other elements of the integrated circuit to be fabricated, the details of which are not needed to understand embodiments of the invention as discussed herein.

It is to be understood that the methods discussed herein for fabricating SiGe fin channel structures can be incorporated within semiconductor processing flows for fabricating other types of semiconductor devices and integrated circuits with various analog and digital circuitry or mixed-signal circuitry. SiGe is a commonly used semiconductor material in integrated circuits for heterojunction bipolar transistors or as a strain-inducing layer for CMOS transistors. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method of forming a semiconductor device, comprising:

forming a semiconductor fin structure on a substrate, wherein the semiconductor fin structure comprises a first sidewall and a second sidewall, wherein a distance between the first and second sidewalls defines a first width of the semiconductor fin structure, wherein the semiconductor fin structure comprises a hard mask layer disposed on a top surface thereof, wherein the hard mask layer comprises a width substantially equal to the first width of the semiconductor fin structure;

etching a least a portion of the first and second sidewalls of the semiconductor fin structure to form first and second recessed sidewalls that define a thinned portion of the semiconductor fin structure, wherein a distance between the first and second recessed sidewalls defines a second width of the thinned portion of the semiconductor fin structure, which is less than the first width;

growing semiconductor alloy layers on the first and second recessed sidewalk of the thinned portion of the semiconductor fin structure; and anisotropically etching the semiconductor alloy layers using the hard mask layer disposed on the semiconductor fin structure as an etch mask to form planarized semiconductor alloy layers of uniform thickness on the first and second recessed sidewalls of the thinned portion of the semiconductor fin structure.

2. The method of claim 1, wherein the semiconductor fin structure has a height that is at least about 30 nm, and wherein the planarized semiconductor alloy layers have a thickness in a range of about 1 nm to about 2 nm.

3. The method of claim 2, wherein each semiconductor alloy layer comprises a silicon-germanium layer.

4. The method of claim 2, wherein the silicon-germanium layer comprises a germanium concentration of at least about 50%.

5. The method of claim 1, wherein etching at least a portion of the first and second sidewalls of the semiconductor fin structure comprises:

oxidizing a surface of the first and second sidewalk to form oxidized layers of the first and second sidewalls; and removing the oxidized layers of the first and second sidewalls to form the first and second recessed sidewalls.

6. The method of claim 1, wherein etching at least a portion of the first and second sidewalk of the semiconductor fin structure comprises isotropically etching the first and second sidewalls using a wet etch process.

7. The method of claim 1, wherein growing the semiconductor alloy layers on the first and second recessed sidewalls comprises epitaxially growing faceted silicon germanium layers on the first and second recessed sidewalk.

8. The method of claim 1, wherein the second width of the thinned portion of the semiconductor fin structure plus a total thickness of the planarized semiconductor alloy layers is substantially equal to the first width of the semiconductor fin structure.

9. The method of claim 1, wherein the thinned portion of the semiconductor fin structure and the planarized semiconductor alloy layers of uniform thickness formed on the first and second recessed sidewalls of the thinned portion collectively form a channel fin structure of an FET (field effect transistor).

10. A method of forming a semiconductor field effect transistor device, comprising:

forming a semiconductor fin structure on a substrate, wherein the semiconductor fin structure comprises a first sidewall and a second sidewall, wherein a distance between the first and second sidewalls defines a first width of the semiconductor fin structure, wherein the semiconductor fin structure comprises a hard mask layer disposed on a top surface thereof, wherein the hard mask layer comprises a width substantially equal to the first width of the semiconductor fin structure;

forming a sacrificial gate structure on a portion of the semiconductor fin structure and hard mask layer, wherein the portion of the semiconductor fin structure covered by the sacrificial gate structure defines a channel region of an FET (field effect transistor);

forming a gate insulating layer over the sacrificial gate structure;

forming source and drain regions on portions of the semiconductor fin structure not covered by the sacrificial gate structure;

etching an opening in the gate insulating layer to expose the sacrificial gate structure;

etching away the sacrificial gate structure down to the substrate to expose the channel region of the semiconductor fin structure and the hard mask layer;

etching the first and second sidewalls of the exposed channel region of the semiconductor fin structure to form first and second recessed sidewalls that define a thinned portion of the semiconductor fin structure, wherein a distance between the first and second recessed sidewalls defines a second width of the thinned portion of the semiconductor fin structure, which is less than the first width;

growing semiconductor alloy layers on the first and second recessed sidewalls of the thinned portion of the semiconductor fin structure;

anisotropically etching the semiconductor alloy layers using the hard mask layer disposed on the semiconductor fin structure as an etch mask to form planarized semiconductor alloy layers of uniform thickness on the first and second recessed sidewalls of the thinned portion of the semiconductor fin structure;

wherein the thinned portion of the semiconductor fin structure and the planarized semiconductor alloy layers of uniform thickness formed on the first and second recessed sidewalls of the thinned portion collectively form a channel fin structure of the FET; and forming a replacement metal gate over the channel fin structure.

11. The method of claim 10, wherein the semiconductor fin structure has a height that is at least about 30 nm, and wherein the planarized semiconductor alloy layers have a thickness in a range of about 1 nm to about 2 nm.

12. The method of claim 11, wherein each semiconductor alloy layer comprises a silicon-germanium layer having a germanium concertation of at least about 50%.

13. The method of claim 10, wherein etching the first and second sidewalls of the exposed channel region of the semiconductor fin structure comprises:

oxidizing a surface of the first and second sidewalls to form oxidized layers of the first and second sidewalls; and removing the oxidized layers of the first and second sidewalls to form the first and second recessed sidewalls.

14. The method of claim 10, wherein growing semiconductor alloy layers on the first and second recessed sidewalls comprises epitaxially growing a faceted silicon germanium layer on the first and second recessed sidewalls of the thinned portion of the semiconductor fin structure.

15. A semiconductor device, comprising:

a semiconductor fin structure disposed on a substrate, wherein the semiconductor fin structure is formed of a first semiconductor material;

wherein a first portion of the semiconductor fin structure comprises a first width which is defined by a distance between a first sidewall and a second sidewall of the first portion of the semiconductor fin structure, wherein the first and second sidewalls extend in a direction along length of the semiconductor fin structure;

wherein a second portion of the semiconductor fin structure comprises a second width, which is less than the first width, wherein the second width is defined by a distance between a first recessed sidewall formed in the first sidewall and a second recessed sidewall formed in the second sidewall of the semiconductor fin structure;

a first semiconductor alloy layer formed on the first recessed sidewall of the second portion of the semiconductor fin structure;

a second semiconductor alloy layer formed on the second recessed sidewall of the second portion of the semiconductor fin structure;

wherein the first and second semiconductor alloy layers have a uniform thickness; and wherein the second portion of the semiconductor fin structure and the first and second semiconductor alloy layers formed on the first and second recessed sidewalls of the second portion of the semiconductor fin structure define a channel fin structure of an FET (field effect transistor).

16. The device of claim 15, wherein the channel fin structure has a width that is substantially equal to the first width of the first portion of the semiconductor fin structure, wherein the width of the channel fin structure is defined by the second width of the second portion of the semiconductor fin structure plus the thickness of the first and second semiconductor alloy layers formed on the first and second recessed sidewalls of the second portion of the semiconductor fin structure.

17. The device of claim 15, further comprising a hard mask layer disposed on top of the second portion of the semiconductor fin structure, the hard mask layer having a width that is substantially equal to the first width.

18. The device of claim 15, wherein the semiconductor fin structure has a height that is at least about 30 nm, and wherein the first and second semiconductor alloy layers have a thickness in a range of about 1 nm to about 2 nm.

19. The device of claim 15, wherein the first and second semiconductor alloy layers comprise silicon-germanium layers having a germanium concertation of at least about 50%.

20. A semiconductor integrated circuit chip comprising the semiconductor device of claim 15.

* * * * *